(12) United States Patent
Miyoshi et al.

(10) Patent No.: US 6,929,890 B2
(45) Date of Patent: Aug. 16, 2005

(54) POSITIVE-TYPE PHOTOSENSITIVE RESIN COMPOSITION

(75) Inventors: Kazuto Miyoshi, Otsu (JP); Ryoji Okuda, Kusatsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 46 days.

(21) Appl. No.: 10/819,177

(22) Filed: Apr. 7, 2004

(65) Prior Publication Data

US 2004/0197703 A1 Oct. 7, 2004

(30) Foreign Application Priority Data

Apr. 7, 2003 (JP) ........................... 2003-102587

(51) Int. Cl.[7] ..................... G03F 7/023; G03F 7/30
(52) U.S. Cl. ..................... 430/7; 430/191; 430/192; 430/193; 430/326
(58) Field of Search ................ 430/7, 191, 192, 430/193, 326

(56) References Cited

U.S. PATENT DOCUMENTS 5,780,201 A 7/1998 Sabnis et al. ............ 430/270.1

6,696,112 B2 * 2/2004 Okuda et al. ............... 428/1.1

FOREIGN PATENT DOCUMENTS

| EP | 1 037 112 | 9/2000 |
| EP | 1 296 540 | 3/2003 |

OTHER PUBLICATIONS

European Search Report dated Sep. 28, 2004, issued in counterpart EP Application No. 04252045.

* cited by examiner

Primary Examiner—John S. Chu
(74) Attorney, Agent, or Firm—Morrison & Foerster LLP

(57) ABSTRACT

Disclosed is a positive-type photosensitive resin composition comprising: (a) an alkali-soluble resin; (b) a quinone diazide compound; (c) a heatsensitive compound which colors upon being heated and which shows an absorption maximum at a wavelength of not less than 350 nm and not more than 700 nm; and (d) a compound which does not have an absorption maximum at a wavelength of not less than 350 nm to less than 500 nm, and has an absorption maximum at a wavelength of not less than 500 nm and not more than 750 nm. The composition is preferably used for forming light-blocking separators or black matrices of organic electroluminescent devices and liquid crystal display elements.

14 Claims, 1 Drawing Sheet

POSITIVE-TYPE PHOTOSENSITIVE RESIN COMPOSITION

BACKGROUND OF THE INVENTION

I. Field of the Invention

The present invention relates to a positive-type photosensitive resin composition suited for forming light-blocking separators and black matrices of organic electroluminescent devices and liquid crystal display elements, which are used in flat panel displays.

II. Description of the Related Art

As flat panel displays, liquid crystal displays (LCDs) which are non-luminescent have been well spread. On the other hand, organic electroluminescent devices used in self-luminescent displays are now widely studied because high brightness can be obtained, and full-color displays can be attained.

Organic electroluminescent devices are operated by applying electric voltage or electric current between a first electrode and a second electrode. When operating an electroluminescent device, since electric field tends to be concentrated to the edge portions of the electrodes, which have small radii of curvature, undesirable phenomena such as dielectric breakdown and generation of leak current are likely to occur at the edge portions of the electrodes.

To reduce these phenomena, it is known to cover the edge portion of the first electrode with an insulation layer (also called separator) (U.S. Pat. No. 6,222,315).

By this technique, concentration of electric field to the edge portion of the electrode can be reduced. Further, the insulation layer may be formed such that the thickness of the insulation layer at the exposed boundary region of the first electrode is larger and larger as the distance from the boundary is larger and larger (see FIG. 1). In other words, the insulation layer can be formed so as to have a "forward-tapered" cross-section. By virtue of this configuration, concentration of the electric field at the edge portion of the electrode is further reduced. Recently, it is tried to make the insulation films and/or element-separating structures have light-blocking properties by adding carbon black to non-photosensitive polyimide resins (Japanese Laid-open Patent Application (Kokai) No. 11-273870). Known materials for constituting the black matrices include negative-type photosensitive materials (U.S. Pat. No. 6,171,733) comprising alkali-soluble resins obtained by polycondensing phenols and aldehydes, acid-crosslinking methylolated melamine compounds, photoacid generators, particular dispersing agents and black pigments; and non-photosensitive materials (U.S. Pat. Nos. 5,780,201 and 5,998,090) comprising polyimide precursors, vehicles therefor, solvents, light-absorbing dyes or mixtures thereof, carbon black pigment or non-carbon black metal oxide pigments and Newton dispersing agents.

In general, as the materials constituting the insulation layers in displays, polyimides, novolaks, acrylic resins and the like are used. These resins include non-photosensitive, negative-type photosensitive and positive-type photosensitive resins. To reduce the concentration of the electric field at the edge portions of the electrodes, positive-type photosensitive resins are preferred. Usually, the effective intensity of ray inside a coating film during exposure decreases as the distance from the surface of the coating film increases. Therefore, by using a positive-type photosensitive resin with which the exposed regions are dissolved, it is easier to form the forward-tapered shape of the cross-section of the exposed region.

A method for preparing a positive-type photosensitive resin composition for black matrices of LCDs is known, in which a quinone diazide compound and a black pigment are added to an alkali-soluble resin such as novolak resin or vinyl polymer (Japanese Laid-open Patent Application (Kokai) No. 6-230215). A method for preparing a light-blocking insulation film for organic electroluminescent devices is known, in which a quinone diazide compound and a coloring agent are added to an alkali-soluble resin such as novolak resin or a polymer of a radical-polymerizable monomer (Japanese Laid-open Patent Application (Kokai) No. 2002-116536).

However, the light-blocking positive-type photosensitive resin compositions prepared by adding coloring agents to the above-mentioned resin compositions have absorption maximum within the wavelength range of 350 nm to 450 nm, which is the wavelength range of mercury lamps usually used as the light sources for exposure, in order to attain sufficient light-blocking property. Therefore, they have a drawback in that the exposure sensitivity is decreased.

On the other hand, a method is known by which the light transmittance in the visible region (wavelength of 400 nm to 700 nm) may be decreased to not more than about 10%, in which a pigment is added to a photoresist for black matrices (Japanese Laid-open Patent Application (Kokai) No. 8-137098). In this method, as the means for coloring, a photoresist containing a cresol-novolak resin and a naphthoquinone diazide photosensitizer is used.

A method for giving light-blocking property to an insulation layer is known, in which a thermosensitive material and a developing agent are added to a positive-type photoresist based on diazoquinone-novolak resin (Japanese Laid-open Patent Application (Kokai) No. 10-170715). By this method, the photosensitive resin does not have light-blocking property before the exposure so that the exposure sensitivity is not decreased, since a positive-type photosensitive resin containing a thermodsensitive material which colors upon being heated and a developing agent is used and since the thermosensitive material and the developing agent are not reacted before the exposure and so the resin is not black before the exposure. However, since ordinary heat-sensitive materials consisting of developing agents and color formers have coloring temperatures of 100° C. to 180° C., they have a problem in the heat-resistance in the final heat treatment (the temperature is usually not lower than 200° C.) after patterning of the coating film. That is, the thermosensitive materials which colored by heat are faded by the final heat-treatment, so that sufficient light-blocking property cannot be obtained. Further, the black color formed by using an ordinary thermosensitive material containing a developing agent and a color former has a problem in the light resistance after the final heat-treatment, that is, the black color is likely to fade upon irradiation with visible and UV lights for a long period of time, so that it is difficult to continuously use the black resin as a black matrix of a display apparatus.

SUMMARY OF THE INVENTION

Accordingly, an object of the present invention is to provide a photosensitive resin composition with which a cured film having light-blocking property and light resistance suitable for forming light-blocking separators and black matrices of organic electroluminescent devices and liquid crystal display elements may be obtained.

That is, the present invention provides a positive-type photosensitive resin composition comprising: (a) an alkali-soluble resin; (b) a quinone diazide compound; (c) a heat-sensitive compound which colors upon being heated and which shows an absorption maximum at a wavelength of not less than 350 nm and not more than 700 nm; and (d) a compound which does not have an absorption maximum at a wavelength of not less than 350 nm to less than 500 nm, and has an absorption maximum at a wavelength of not less than 500 nm and not more than 750 nm.

By the present invention, a photosensitive resin composition which is positive-type, that is, with which the exposed regions are dissolved in the aqueous alkaline developer is provided. Moreover, by using the photosensitive-resin composition according to the present invention, a cured film which has a good light-blocking property, that is, having an optical density of not less than 0.3, and which retains the optical density of not less than 50% after being irradiated with light for 500 hours may be obtained, which is suited for forming the light-blocking separators and black matrices of organic electroluminescent (EL) devices and liquid crystal display elements. Thus, by using the cured film formed from the photosensitive resin composition according to the present invention as the light-blocking separator or the black matrix, a high quality organic EL device or liquid crystal display element may be provided.

DETAILED DESCRIPTION OF THE PREFERRED EMBODIMENTS

Figure 1:
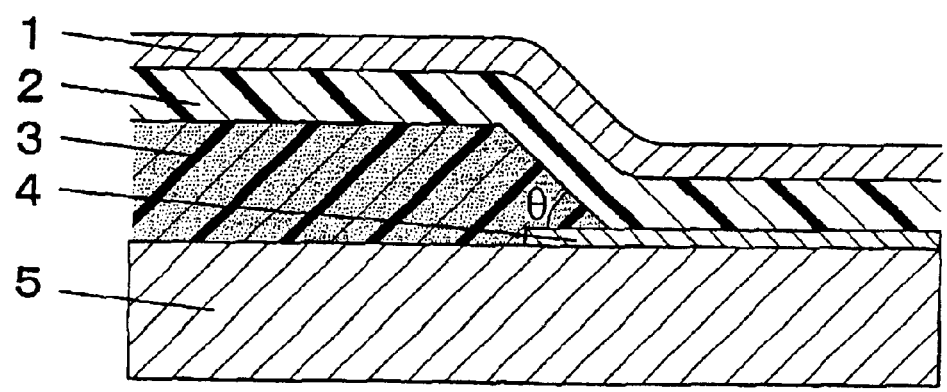
FIG. 1 is a cross-sectional view of the boundary region of an insulation layer.

The (a) component, that is, the alkali-soluble resin is a resin which is soluble in the aqueous alkali solution used as the developer. Examples of the alkali-soluble resin include phenolic resins, polymers containing, as a monomer component constituting the polymer, a radical-polymerizable monomer having an alkali-soluble group, polyimide precursors, polyimides and polybenzoxazole precursors, but the alkali-soluble resins are not restricted to these resins. The polymers mentioned above preferably have alkali-soluble groups in each of the polymer molecules. Preferred alkali-soluble resins are those with which the amount of gas released therefrom is small when the resin is subjected to a high temperature at not lower than 200° C. in the heat-treatment, because such polymers exhibit excellent heat resistance and characteristics suited for separators of organic EL devices. Examples of such preferred alkali-soluble resins include polyimides, polyhydroxyamides, polyimide precursors such as polyamic acids and esters thereof, and polybenzoxazole precursors.

Examples of the above-mentioned alkali-soluble groups include carboxyl group, phenolic hydroxyl group, sulfonyl group and thiol group.

The phenolic resins which may be employed as the alkali-soluble resin in the present invention include novolak phenolic resins and resol phenolic resins. These resins may be obtained by polycondensing one or more phenols with an aldehyde such as formalin.

Examples of the phenols which may be used for constituting the novolak phenolic resins and resol phenolic resins include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis(p-cresol), resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol and β-naphthol. The phenols may be used individually or two or more of the phenols may be used in combination.

Examples of the aldehydes include formalin, p-formaldehyde, acetaldehyde, benzaldehyde, hydroxybenzaldehyde and chloroacetaldehyde. The aldehydes may be used individually or two or more of the aldehydes may be used in combination.

The weight average molecular weight of the phenolic resin which may be used in the present invention is preferably 2000 to 50,000, more preferably 3000 to 30,000, the weight average molecular weight being measured using gel permeation chromatography and expressed in terms of the molecular weight of polystyrene. If the weight average molecular weight is more than 50,000, the developing performance and sensitivity tend to be degraded, and if it is less than 2000, the shape of pattern, resolution, developing performance and heat resistance tend to be degraded.

As the radical-polymerizable monomers having alkali-soluble groups, which may be used for synthesizing the polymers which may be employed as the component (a), the following monomers are exemplified. Examples of the radical-polymerizable monomers having phenolic hydroxyl group or carboxyl group include o-hydroxystyrene, m-hydroxystyrene and p-hydroxystyrene, as well as substitution products thereof substituted with alkyl, alkoxy, halogen, haloalkyl, nitro, cyano, amide, ester or carboxyl group; polyhydroxyvinylphenols such as vinyl hydroquinone, 5-vinylpyrogallol, 6-vinylpyrogallol, 1-vinylfluoroglycinol; o-vinyl benzoic acid, m-vinylbenozic acid and p-vinylbenzoic acid as well as substitution products thereof substituted with alkyl, alkoxy, halogen, haloalkyl, nitro, cyano, amide or ester group; methacrylic acid and acrylic acid, as well as substitution products thereof substituted with haloalkyl, alkoxy, halogen, nitro or cyano at the α-position; divalent unsaturated carboxylic acids such as maleic acid, maleic anhydride, fumaric acid, fumaric anhydride, citraconic acid, mesaconic acid, itaconic acid and 1,4-cyclohexenedicarboxylic acid, as well as half esters thereof esterified with methyl, ethyl, propyl, isopropyl, n-butyl, sec-butyl, tert-butyl, phenyl, or o-, m- or p-toluyl group, and half amides thereof.

Among these, o-hydroxystyrene, m-hydroxystyrene, and p-hydroxystyrene, as well as substitution products thereof substituted with alkyl or alkoxy group are preferred in view of the sensitivity in patterning, normalized remaining film thickness, heat transformation resistance, solvent resistance, adhesiveness with the underlying substrate and preservation stability of the solution. These monomers may be used individually or two or more of these may be used in combination.

Examples of other radical-polymerizable monomers which may be used for synthesizing the component (a) together with the above-mentioned radical-polymerizable monomers having alkali-soluble groups, include styrene and substitution product thereof substituted with alkyl, alkoxy, halogen, haloalkyl, nitro, cyano, amide or ester at α-, o-, m- or p-position; diolefins such as butadiene, isoprene and chloroprene; esters of methacrylic acid and acrylic acid esterified with methyl, ethyl, n-propyl, isopropyl, n-butyl, sec-butyl, tert-butyl, pentyl, neopentyl, isoamylhexyl, cyclohexyl, adamantyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoroethyl, perfluoroethyl, perfluoro-n-propyl, perfluoroisopropyl, triphenylmethyl, tricyclo[5.2.1.0²,⁶]decane-8-yl (common name: dicyclopentanyl), cumyl, 3-(N,N-dimethylamino) propyl, 3-(N,N-dimethylamino)ethyl, furyl or furfuryl group; anilides and amides of methacrylic acid and acrylic acid such as N,N-dimethyl, N,N-diethyl, N,N-dipropyl, N,N-diisopropyl and anthranyl amides; acrylonitrile, acrolein, methacrylonitrile, vinyl chloride, vinylidene chloride, vinyl fluoride, vinylidene fluoride, N-vinylpyrrolidone, vinylpyridine, vinyl acetate, N-phenylmaleimide, N-(4-hydroxyphenyl)maleimide, N-methacryloylphthalimide and N-acryloylphthalimide. These monomers may be used individually or two or more of these may be used in combination.

Among the monomers mentioned above, styrene, substitution product of styrene substituted with alkyl, alkoxy, halogen or haloalkyl group at α-, o-, m- or p-position; butadiene and isoprene; methacrylic acid, and esters of acrylic acid esterified with methyl, ethyl, n-propyl, N-butyl, glycidyl or tricyclo[5.2.1.0²,⁶]decane-8-yl group are preferred in view of the sensitivity in patterning, normalized remaining film thickness, heat transformation resistance, solvent resistance, adhesiveness with the underlying substrate and preservation stability of the solution.

In cases where a copolymer of the radical-polymerizable monomer(s) having phenolic hydroxyl group and the other radical-polymerizable monomer(s) is used as the component (a), the content of the other radical-polymerizable monomer (s) may preferably be not more than 30% by weight, more preferably 5 to 20% by weight based on the total of the radical-polymerizable monomer(s) having phenolic hydroxyl group and the other radical-polymerizable monomer(s). In cases where a copolymer of the radical-polymerizable monomer(s) having carboxyl group and the other radical-polymerizable monomer(s) is used as the component (a), the content of the other radical-polymerizable monomer(s) may preferably be not more than 90% by weight, more preferably 10 to 80% by weight based on the total of the radical-polymerizable monomer(s) having carboxyl group and the other radical-polymerizable monomer (s). If the content of the above-mentioned other radical-polymerizable monomer(s) with respect to the radical-polymerizable monomer having phenolic hydroxyl group or carboxyl group is larger than those mentioned above, development with an alkaline solution may be difficult in some cases.

Examples of the solvents which may be used for the production of the polymers containing radical-polymerizable monomers having alkali-soluble groups include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethylmethyl ether; propylene glycol monoalkyl ethers such as propylene glycol monomethyl ether, propylene glycol monoethyl ether, propylene glycol monopropyl ether and propylene glycol monobutyl ether; propylene glycol alkylether acetates such as propylene glycol methyl ether acetate, propylene glycol ethyl ether acetate, propylene glycol propyl ether acetate and propylene glycol butyl ether acetate; propylene glycol alkylether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate. The amount of the solvent to be used may preferably be 20 to 1000 parts by weight per 100 parts by weight of the reaction materials.

Examples of the polymerization initiator which may be used for the production of the polymer containing the radical-polymerizable monomer having the alkali-soluble group include azo compounds such as 2,2'-azobisisobutyronitrile, 2,2'-azobis-(2,4-dimethylvaleronitrile) and 2,2'-azobis-(4-methoxy-2,4-dimethylvaleronitrile); organic hydroperoxides such as benzoyl peroxide, lauroyl peroxide, t-butylperoxy pivalate and 1,1'-bis-(t-butylperoxy)cyclohexane; and hydrogen peroxide. In cases where a peroxide is used as the radical polymerization initiator, a reducing agent may be used together with the peroxide so as to form a redox-type initiator.

The weight average molecular weight of the polymer containing the radical-polymerizable monomer(s) having the alkali-soluble group(s), which may be used in the present invention is preferably 2000 to 100,000, more preferably 3000 to 50,000, still more preferably 5000 to 30,000, the weight average molecular weight being measured using gel permeation chromatography and expressed in terms of the molecular weight of polystyrene. If the weight average molecular weight is more than 100,000, the developing performance and sensitivity tend to be degraded, and if it is less than 2000, the shape of pattern, resolution, developing performance and heat resistance tend to be degraded.

The polymer containing the radical-polymerizable monomer(s) having the alkali-soluble group(s) may be used individually or two or more of the polymers may be used in combination. The carboxyl groups or the phenolic hydroxyl groups may be protected before the polymerization, and the protective groups may be removed after the polymerization, thereby giving alkali-solubility. The polymer may be hydrogenated so as to change the transparency to visible light or to change the softening point.

As the (a) component, at least one selected from the group consisting of the resins represented by, or containing one or more of the structural units as the major constituent, of the following formulae may be employed:

to organic solvent of the polymer having ring structures formed by the heat treatment is decreased, and the solubility in fuming nitric acid is decreased. Thus, the content of fluorine atoms is preferably not less than 10% by weight and not more than 20% by weight.

In the above-described formulae (1) to (5), $R^1$ represents a moiety of acid dianhydride contained in the acid dianhydride units, and represents an organic group having not less than 2 carbon atoms and a valence of 2 to 8. $R^1$ may preferably be an organic group having 6 to 30 carbon atoms and 0 to 2 hydroxyl groups, which contains an aromatic ring or aliphatic ring.

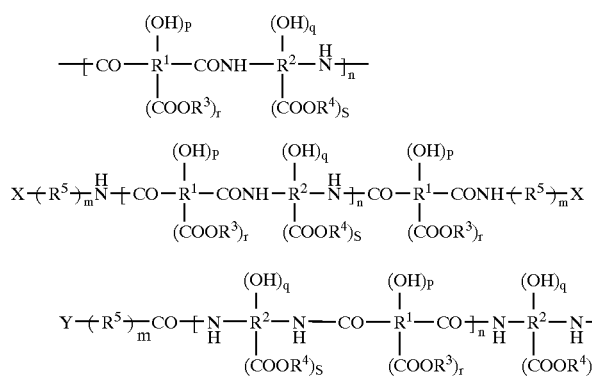

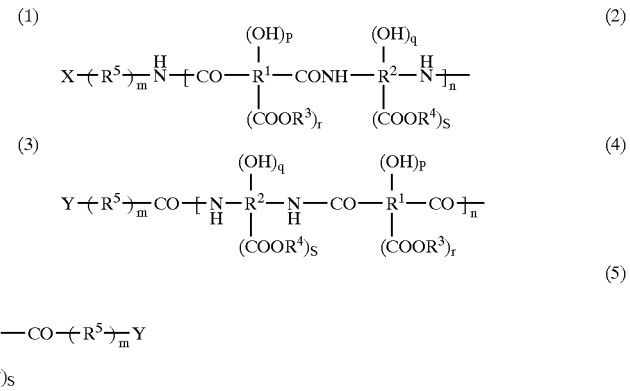

(wherein in Formulae (1) to (5), $R^1$ represents an organic group having not less than 2 carbon atoms and a valence of 2 to 8; $R^2$ represents an organic group having not less than 2 carbon atoms and a valence of 2 to 6; $R^3$ and $R^4$ independently represent hydrogen or organic groups having 1 to 20 carbon atoms; $R^5$ represents a divalent organic group; X and Y independently represent organic groups having at least one substituent selected from the group consisting of $C_1$–$C_{10}$ hydrocarbon groups containing at least one organic group selected from the group consisting of carboxyl group, phenolic hydroxyl group, sulfonic group and unsaturated hydrocarbon groups, nitro group, methylol group, ester group, hydroxyalkinyl group and $C_1$–$C_{10}$ hydrocarbon groups; n represents a number ranging from 5 to 100,000; m represents an integer of 0 to 10; p and q independently represent integers of 0 to 4; and r and s independently represent integers of 0 to 2; and p+q>0).

The alkali-soluble resins represented by, or containing one or more of the structural units as the major constituent, represented by the above-described formulae (1) to (5) may be converted to a polymer having imide rings, oxazole rings or other ring structures. Thus, they are heat-resistant resin precursors whose heat resistance and resistance to organic solvent are greatly increased, upon forming ring structures.

The formulae (1) to (5) represent polyamic acids having hydroxyl groups. By virtue of the hydroxyl groups, the solubility in aqueous alkali solution is increased when compared to the polyamic acids which do not have the hydroxyl groups. Among the types of hydroxyl groups, phenolic hydroxyl group is preferred in view of the solubility in aqueous alkali solution. By incorporating fluorine atoms in the structures represented by the formulae (1) to (5) in an amount of not less than 10% by weight, appropriate water repellent property is given to the interface of the film, so that penetration of water or aqueous solution into the interface is inhibited. However, a content of fluorine atoms of more than 20% by weight is not preferred because the solubility in aqueous alkali solution is decreased, resistance Examples of the acid dianhydrides incorporating $R^1$ therein, which do not have hydroxyl groups include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 2,2-bis(4-(4-aminophenoxy)phenyl)propane, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxyphenoxy)phenyl)hexafluoropropane dianhydride, 2,2-bis(4-(3,4-dicarboxybenzoyloxy)phenyl)hexafluoropropane dianhydride, 2,2'-bis(trifluoromethyl)-4,4'-bis(3,4-dicarboxyphenoxy)biphenyl dianhydride; and aliphatic tetracarboxylic dianhydrides such as cyclobutanetetracarboxylic dianhydride, 1,2,3,4-cyclopentanetetracarboxylic dianhydride, 2,3,5,6-cyclopentanetetracarboxylic dianhydride, 5-(2,5-dioxotetrahydro-3-furanyl)-3-methyl-3-cyclohexene-1,2-dicarboxylic dianhydride, "TDA100" and "Ricaresin TMEG" (both are trademarks commercially available from New Japan Chemical Co., Ltd). Among these, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'- benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3dicarboxyphenyl)ethane dianhydride, bis(3,4dicarboxyphenyl)methane dianhydride, bis(2,3-dicarboxyphenyl)methane dianhydride, bis(3,4dicarboxyphenyl)sulfone dianhydride, bis(3,4dicarboxyphenyl)ether dianhydride, 2,2-bis(4-(4-aminophenoxy)phenyl)propane, 2,2-bis(3,4-dicarboxyphenyl)hexafluoropropane dianhydride, 2,2-bis(4-(3,4-dicarboxybenzoyloxy)phenyl)hexafluoropropane dianhydride, 2,2'-bis(trifluoromethyl)-4,4'-bis(3,4-dicarboxyphenoxy)biphenyl dianhydride are preferred.

Preferred examples of $R^1$ to which hydroxyl groups are attached include those represented by the following formulae: (The formulae are shown together with the hydroxyl groups and —$COOR^3$ groups bound to $R^1$.)

diaminodiphenyl sulfone, 3,4'-diaminodiphenyl sulfide, 4,4'-diaminodiphenyl sulfide, 1,4-bis(4-aminophenoxy)benzene, benzine, m-phenylenediamine, p-phenylenediamine, 3,5-diaminobenzoic acid, 1,5-naphthalene diamine, 2,6-naphthalene diamine, bis(4-aminophenoxyphenyl)sulfone, bis(3-aminophenoxyphenyl)sulfone, bis(4-aminophenoxyphenyl)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl and 2,2'-di(trifluoromethyl)-4,4'-diaminobiphenyl, as well as these structures substituted by alkyl groups and/or halogens on the aromatic rings, and cyclohexyl diamine and methylenebiscyclohexyl diamine which are aliphatic diamines. However, the examples are not restricted to those described above. These structural units

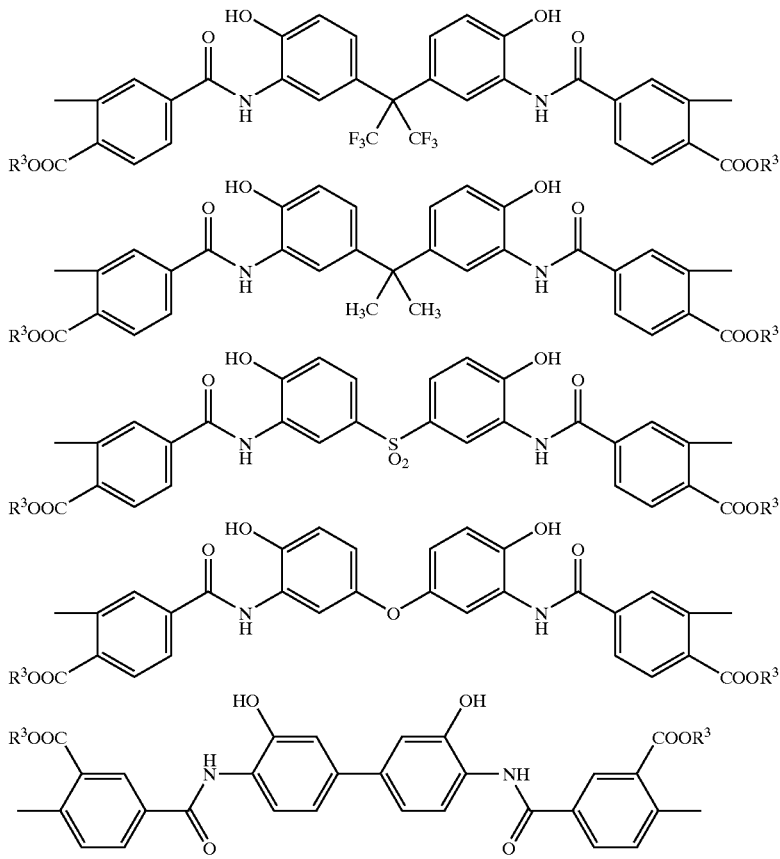

However, the examples are not restricted to those described above. These structural units may be employed individually or two or more of these may be employed in combination.

$R^2$ contained in the diamine units in the structures represented by the above-described formulae (1) to (5) represents an organic group having not less than 2 carbon atoms and a valence of 2 to 6. $R^2$ may preferably be an organic group having 6 to 30 carbon atoms which contains aromatic ring(s) or aliphatic ring(s). Examples of the diamines incorporating $R^2$ therein, which do not contain hydroxyl groups include 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'- may be employed individually or two or more of these may be employed in combination.

Examples of the diamines incorporating $R^2$ therein, which have hydroxyl groups, include those having fluorine atoms such as 2,2-bis[4-(amino-3-hydroxyphenyl)hexafluropropane, 2,2-bis[4-(4-amino-3-hydroxyphenoxy)phenyl]hexafluoropropane; and those not having fluorine atoms such as diaminodihydroxypyrimidine, diamiodihydroxypyridine, hydroxy-diamino-pyrimidine, diaminophenol, dihydroxybenzidine; and "ABCH" and "ABPS" (both are trademarks commercially available from Nippon Kayaku Co., Ltd).

Preferred examples of $R^2$ to which hydroxyl group(s) is(are) bound include those represented by the following formulae: (The formulae are shown together with the hydroxyl group(s) bound to $R^2$.)

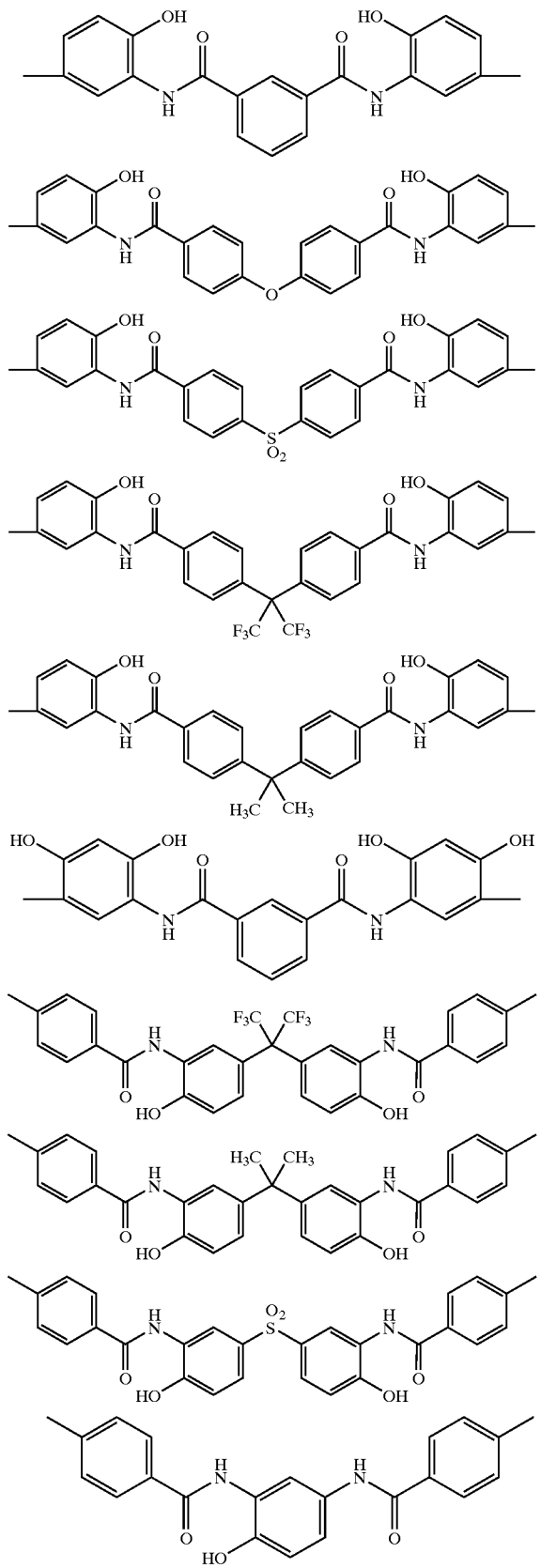

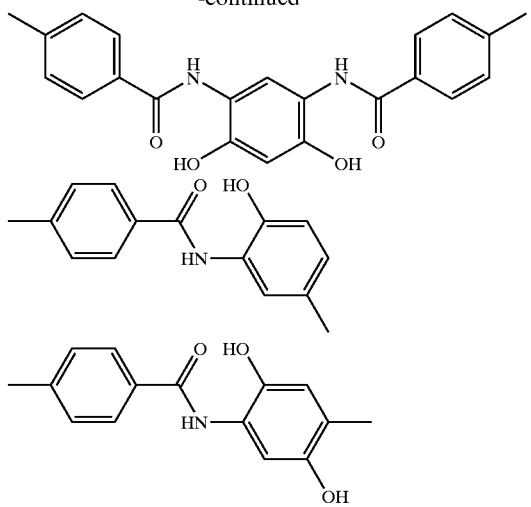

These structures may be employed individually or two or more of these structures may be employed in combination.

In formulae (1) to (5), $R^3$ and $R^4$ may be the same or different, and represent hydrogen or organic groups having 1 to 20 carbon atoms. Preferred organic groups are alkyl groups having 1 to 20 carbon atoms, which are represented by the following formula (6) or (7):

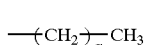 (6)

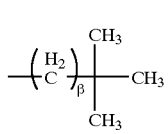 (7)

In formula (6), α represents an integer of 0 to 19, preferably 0 to 3. In formula (7), β represents an integer of 0 to 16, preferably 0 to 2.

From the viewpoint of the stability of the positive-type photosensitive resin solution, it is preferred that $R^3$ and $R^4$ are alkyl groups. On the other hand, from the viewpoint of solubility in aqueous alkali solution, it is preferred that $R^3$ and $R^4$ are hydrogen atoms. Since a plurality of $R^3$ groups and/or $R^4$ groups are contained in the polymer molecule, hydrogen atoms and alkyl groups may be employed in combination for $R^3$ and/or $R^4$. By controlling the ratio between the hydrogen atoms and the alkyl groups for $R^3$ and/or $R^4$, the dissolution rate of the resin in the aqueous alkali solution may be controlled, so that a positive-type photosensitive resin composition having a desired dissolution rate may be obtained by controlling the ratio. Preferably, 10 to 90% of the total of $R^3$ and $R^4$ are hydrogen atoms, and the remainder are alkyl groups. If the number of carbon atoms in $R^3$ or $R^4$ exceeds 20, the solubility in the aqueous alkali solution is decreased.

In formulae (2) and (3), the structure represented by —NH—$(R^5—)_m$—X is preferably represented by the following formula (8) which is a structure derived from a primary monoamine used as the end cap compound:

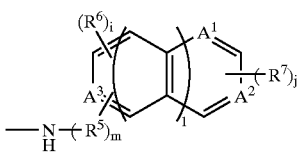

(8)

In formulae (4) and (5), the structure represented by —CO—(R$^5$—)$_m$—Y is preferably represented by the following formula (9) or (10) which is a structure derived from an acid anhydride, monocarboxylic acid, monoacid chloride compound or mono-active ester compound used as the end cap compound:

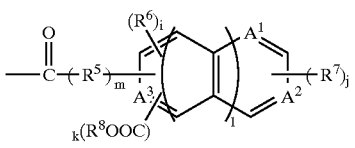

(9)

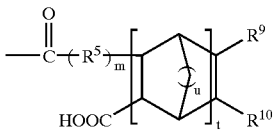

(10)

In the above-described formulae (8) to (10), R$^5$ represents a divalent organic group, and preferably —CR$^{11}$R$^{12}$—, —CH$_2$O— or —CH$_2$SO$_2$—, wherein R$^{11}$ and R$^{12}$ independently represent hydrogen atom, hydroxyl group or C$_1$–C$_{10}$ hydrocarbon group. R$^9$ and R$^{10}$ independently represent hydrogen atom, hydroxyl group, carboxyl group or C$_1$–C$_{10}$ hydrocarbon group, or R$^9$ and R$^{10}$ may directly be bound to form C$_3$–C$_{10}$ cyclic hydrocarbon group. R$^8$ represents hydrogen atom or C$_1$–C$_{10}$ hydrocarbon group. Among these, hydrogen atom and C$_1$–C$_4$ hydrocarbon group are preferred, and hydrogen atom, methyl, and t-butyl are especially preferred. R$^6$ and R$^7$ independently represent hydrogen atom, hydroxyl, carboxyl, sulfonyl, thiol, C$_1$–C$_{10}$ hydrocarbon group having at least one unsaturated hydrocarbon group, nitro, methylol, ester, hydroxyalkinyl or C$_1$–C$_{10}$ hydrocarbon group. A$^1$ to A$^3$ independently represent carbon atom or nitrogen atom. Further, m represents an integer of 0 to 10, preferably 0 to 4; l represents an integer of 0 or 1, preferably 0; i represents an integer of 0 or 1, preferably 0; j represents an integer of 1 to 3, preferably 1 or 2; and t, k and u independently represent 0 or 1.

Examples of the primary monoamine used as the end cap compound from which the structure represented by formula (8) is derived include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-O-toluic acid, ameride, 2-aminobenzoic acid, 3-aminobenzoic acid, 4-aminobenzoic acid, 2-aminobenzene sulfonic acid, 3-aminobenzene sulfonic acid, 4-aminobenzene sulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethylaniline, 3-ethylaniline, 4-ethylaniline, 2,4-diethylaniline, 2,5-diethylaniline, 2,6-diethylaniline, 3,4-diethylaniline, 3,5-diethylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene and 4,8-diethynyl-2-aminonaphthalene, but the monoamine is not restricted to those mentioned above.

Among these, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline, 3,5-diethynylaniline and the like are preferred.

Examples of the compounds selected from the group consisting of acid anhydrides, monocarboxylic acids, monoacid chloride compounds and mono-active ester compounds used as the end cap compound from which the structure represented by formula (9) or (10) is derived include acid anhydrides such as phthalic anhydride, maleic anhydride, nadic acid, cyclohexanedicarboxylic anhydride and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid, as well as monoacid chlorides thereof, monoacid chloride of dicarboxylic acids (i.e., only one carboxyl group of the two carboxyl groups is converted to acid chloride) such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene; and active ester compounds obtained by reacting the above-mentioned monoacid chloride compound and N-hydroxybenzotriazole or N-hydroxy-5-norbornene-2,3-dicarboxyimide.

Among these, preferred are acid anhydrides such as phthalic anhydride, maleic anhydride, nadic acid, cyclohexanedicarboxylic anhydride and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid and 3,5-diethynylbenzoic acid, as well as monoacid chlorides thereof; monoacid chlorides of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene; and active ester compounds obtained by reacting the above-mentioned monoacid chloride compound and N-hydroxybenzotriazole or N-hydroxy-5-norbornene-2,3-dicarboxyimide.

The content of the monoamine component represented by formula (8) based on the total amine components may preferably be 0.1 to 60 mol %, more preferably 5 to 50 mol %. The content of the component selected from the group consisting of acid anhydrides, monocarboxylic acids, monoacid chloride compounds and mono-active ester compounds used as the end cap compound from which the structure represented by formula (9) or (10) may preferably be 0.1 to 100 mol %, more preferably 5 to 90 mol % based on the total of the diamine components. A plurality of types of end cap groups may be introduced by using a plurality of types of end cap compounds.

In formulae (1) to (5), n represents the number of repeating units of the polymer, and is preferably 10 to 100,000.

To promote the adhesion with the substrate, an aliphatic group having siloxane structure may be copolymerized with $R^1$ and/or $R^2$ to the extent that heat resistance is not substantially decreased. More particularly, bis(3-aminopropyl)tetramethyldisiloxane, bis(p-aminophenyl)octamethylpentanesiloxane or the like may be copolymerized in an amount of 1 to 15 mol %.

The polymers represented by, or containing one or more of the structural units as the major constituent, represented by the above-described formulae (1) to (5) may be synthesized according to known methods, for example, by reacting the tetracarboxylic dianhydride(s) and the diamine compound(s) (a part thereof is replaced with the monoamine used as the end cap compound); by reacting the tetracarboxylic dianhydride(s) (a part thereof is replaced with the acid anhydride, monoacid chloride or the mono-activated ester compound used as the end cap compound) with the diamine compound(s); by reacting the tetracarboxylic dianhydride and an alcohol to obtain a diester, and then reacting the obtained diester with the diamine(s) (a part thereof is replaced with the monoamine used as the end cap compound) in the presence of a condensing agent; or by reacting the tetracarboxylic dianhydride and an alcohol to obtain a diester, then converting the remaining dicarboxylic acid to acid chloride, and reacting the resultant with the diamine(s) (a part thereof is replaced with the monoamine used as the end cap compound). The polymers may preferably be synthesized according to known methods such as, for example, by reacting the tetracarboxylic dianhydride(s) and the diamine compound(s) (a part thereof is replaced with the monoamine used as the end cap compound) at a temperature of, for example, room temperature to 80° C. for 1 to 8 hours; by reacting the tetracarboxylic dianhydride and an alcohol to obtain a diester, and then reacting the obtained diester with the diamine(s) (a part thereof is replaced with the monoamine used as the end cap compound) in the presence of a condensing agent such as dicyclohexylcarbodiimide at −30° C. to room temperature for 1 hour to 8 hours, or by reacting the tetracarboxylic dianhydride and an alcohol to obtain a diester, then converting the remaining dicarboxylic acid to acid chloride, and reacting the resultant with the diamine(s) (a part thereof is replaced with the monoamine used as the end cap compound) at −30° C. to room temperature for 1 hour to 8 hours.

Examples of the reaction solvent used in these reactions include N-methyl-2-pyrrolidone, N,N-dimethylacetamide and γ-butyrolactone.

The end cap compound introduced in the polymer may easily be detected by for example, dissolving the polymer to which the end cap compound is introduced in an acidic solution so as to decompose the polymer into the amine component(s) and acid anhydride component(s) constituting the polymer, and subjecting the resultant to gas chromatography (GC) or NMR; or by directly subjecting the polymer to which the end cap compound is introduced to pyrolysis gas chromatography (PGC), infrared spectrum or $C_{13}$NMR spectrum.

The alkali-soluble resin used in the present invention may be constituted by the phenol resin, the polymer containing the radical-polymerizable monomer having the alkali-soluble groups, and/or the polymer represented by, or containing one or more of the structural units as the major constituent, represented by the above-described formulae (1) to (5). Alternatively, the phenol resin, the polymer containing the radical-polymerizable monomer having the alkali-soluble groups, or the polymer represented by, or containing one or more of the structural units as the major constituent, represented by the above-described formulae (1) to (5) may be mixed with one or more other polymers, or copolymerized with one or more other units. In these cases, the total contents of the one or more other polymers to be mixed, or the total contents of one or more other units to be copolymerized are preferably not more than 50 mol %, more preferably not more than 30 mol %.

To the alkali-soluble resin used in the present invention, one or more epoxy compounds and one or more epoxy curing agents may be added. Examples of the epoxy compounds include bisphenol A type epoxy compounds, bisphenol F type epoxy compounds, phenol novolak epoxy compounds, cresol novolak epoxy compounds, trishydroxyphenyl methane type epoxy compounds, alicyclic epoxy compounds, glycidyl ester type epoxy compounds, glycidylamine type epoxy compounds, heterocyclic epoxy compounds and fluorene group-containing epoxy compounds. As the curing agents, usual curing agents such as alcohols, phenols, amines, acid anhydrides, compounds having active hydrogen atoms may be employed. Cationic curing catalysts such as onium salts may also be employed.

As the quinone diazide compound, which is the (b) component, the compounds obtained by esterification of the compounds having phenolic hydroxyl groups with naphthoquinone diazide sulfonic acid are preferred. Examples of the compounds having phenolic hydroxyl group(s) include Bis-Z, Bis P-EZ, TekP-TPA, TekP-4HBPA, Tris P-HAP, Tris P-PA, Tris P-PHBA, Bis OCHP-Z, Bis P-MZ, Bis P-PZ, Bis P-IPZ, Bis OCP-IPZ, Bis P-CP, Bis RS-2P, Bis RS-3P, Bis P-OCHP, methylenetris-p-CR, methylenetetra-p-CR, Bis RS-26X, Bis-PFP-PC (all of the above are trademarks, commercially available from Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (trademarks, commercially available from Asahi Organic Chemicals Industry Co., Ltd.), naphthol, tetrahydrobenzophenone, methyl gallate, bisphenol A, methylenebisphenol and Bis P-AP (trademark, commercially available from Honshu Chemical Industry Co., Ltd). These compounds having phenolic hydroxyl group(s) may preferably be esterified by 4-naphthoquinone diazide sulfonic acid or 5-naphthoquinone diazide sulfonic acid. Sulfone amide compounds obtained by binding naphthoquinone diazide sulfonic acid with a compound having amino group(s) may also be employed.

The structures of the compounds having phenolic groups are exemplified below.

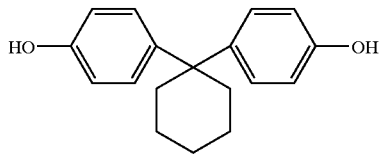

Bis-Z

-continued

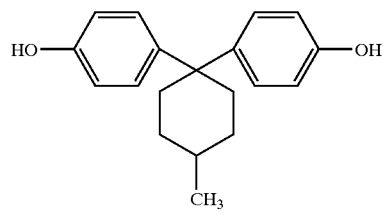

BisP-MZ

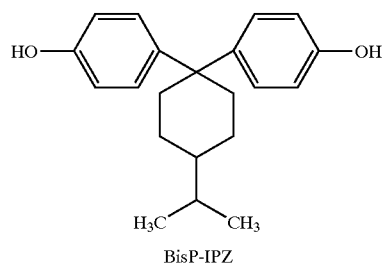

BisP-IPZ

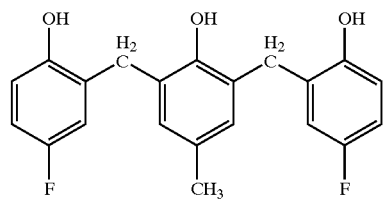

Bis-PFP-PC

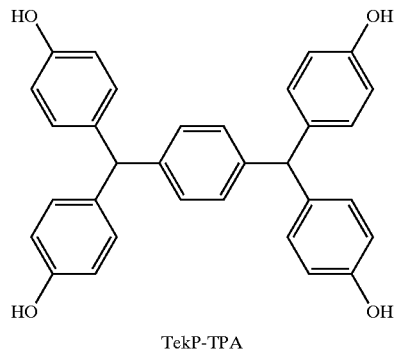

TekP-TPA

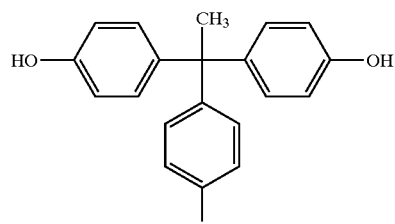

TrisP-HAP

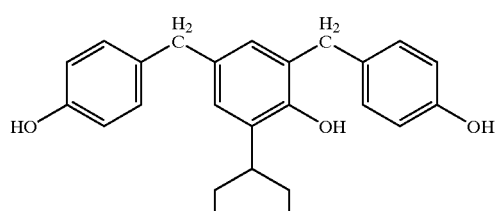
BisP-OCHP
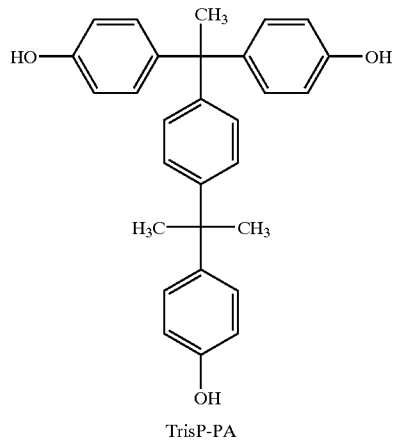
TrisP-PA
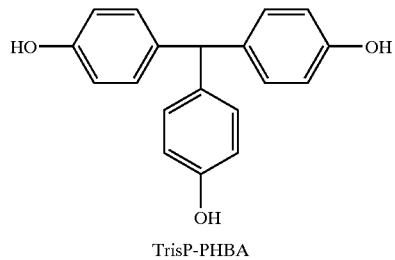
TrisP-PHBA
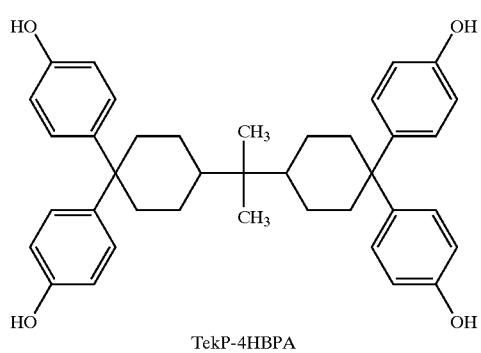
TekP-4HBPA
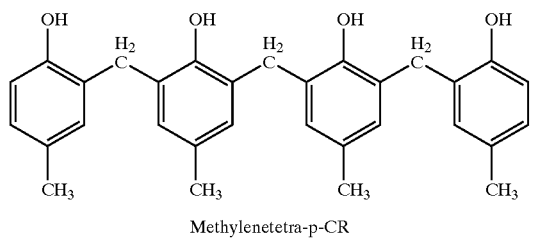
Methylenetetra-p-CR
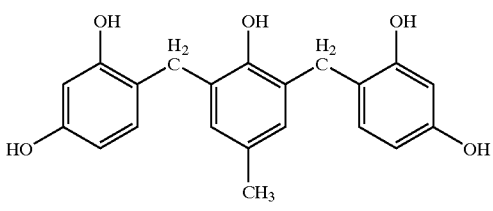
BIR-PC
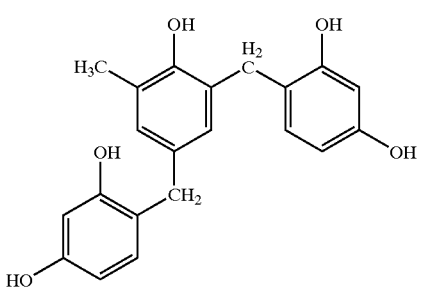
BIR-OP
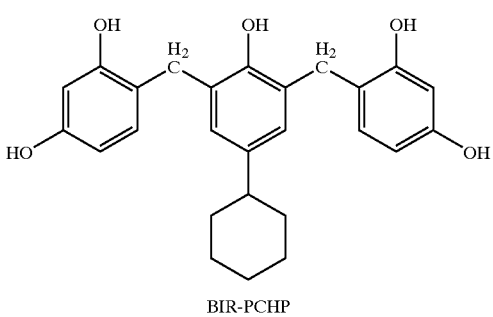
BIR-PCHP
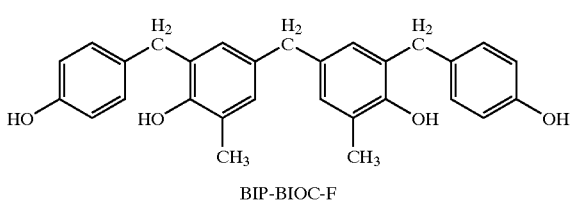
BIP-BIOC-F
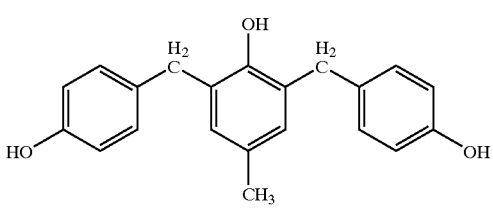
BIP-PC
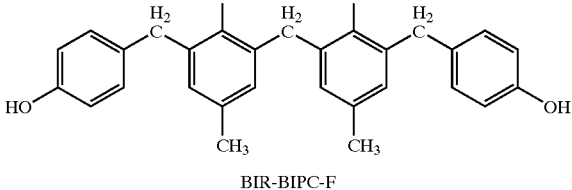
BIR-BIPC-F

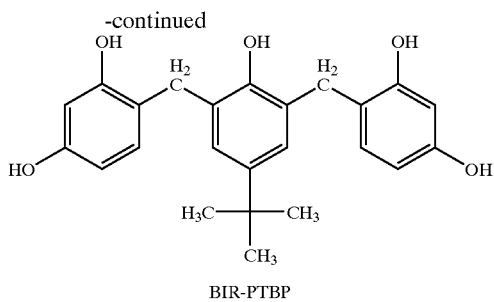

BIR-PTBP

The naphthoquinone diazide compound used in the present invention preferably has a molecular weight of 300 to 1000, more preferably 350 to 800. If the molecular weight of the naphthoquinone diazide compound exceeds 1000, the naphthoquinone diazide compound may not be well thermally decomposed in the later heat treatment, so that the problems that the heat resistance, mechanical characteristic, and/or adhesion of the obtained film is (are) decreased, may be brought about. The amount of the naphthoquinone diazide compound added may preferably be 1 to 50 parts by weight per 100 parts by weight of the (a) component.

To improve the developing performance in development with an alkaline developer, one or more of the above-described compounds having phenolic hydroxyl group(s) may be added without being esterified with the naphthoquinone diazide. By adding the compound having phenolic hydroxyl group(s), the resin composition is not substantially dissolved in the alkaline developer before exposure, and is easily dissolved in the alkaline developer after exposure, loss of film by the development is small and development in a shorter time may be attained. The amount of the compound having phenolic hydroxyl group(s) added is preferably 1 to 50 parts by weight, more preferably 3 to 40 parts by weight per 100 parts by weight of the component (a).

The (c) component is a heatsensitive compound which colors upon being heated, which color has an absorption maximum at a wavelength of not less than 350 nm and not more than 700 nm, more preferably not less than 350 nm and not more than 500 nm. If the color formed by the heatsensitive compound has a wavelength of shorter than 350 nm or a wavelength of longer than 700 nm, the film after the final heat treatment after the patterning does not have absorption in the visible range, so that it is difficult to make the film black.

The (c) component used in the present invention is preferably a heatsensitive compound which colors at a temperature higher than 120° C., more preferably at a temperature higher than 180° C. The higher the temperature at which the heatsensitive compound colors, the better the heat resistance at high temperatures, and the better the light resistance so that the degree of fading by irradiation with UV/visible light for a long time is smaller.

The (c) component used in the present invention may be an ordinary thermo sensitive dye or pressure sensitive dye or other compound. These heatsensitive compounds may be those which color by changing the chemical structures or states of electric charge by the action of acidic groups existing in the system during heating, or those which color by thermal oxidation reaction or the like with the oxygen in the air. The skeleton structure of the heatsensitive compounds may be triaryl methane skeleton, diaryl methane skeleton, fluorane skeleton, bislactone skeleton, phthalide skeleton, xanthene skeleton, rhodamine lactam skeleton, fluorene skeleton, phenothiazine skeleton, phenoxazine skeleton or spiropyrane skeleton.

Examples of the heatsensitive compounds include 4,4',4"-tris(dimethylamino)triphenylmethane, 4,4',4"-tris(diethylamino)-2,2'2"-triphenylmethane, 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(3-hydroxyphenyl)methylene]bis[2,6-dimethylphenol], 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(3-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4'''-(1,2-ethanediylidene)tetrakisphenol, 4,4',4",4'''-(1,2-ethanediylidene)tetrakis[2-methylphenol], 4,4',4",4'''-(1,2-ethanediylidene)tetrakis[2,6-dimethylphenol], 4,4',4",4'''-(1,4-phenylenedimethylidene)tetrakisphenol, 4,4',4",4'''-(1,4-phenylenedimethylidene)tetrakis(2,6-dimethylphenol), 4,4'-[(2-hydroxyphenyl)methylene]is[3-methylphenol], 2,2'-[(3-hydroxyphenyl)methylene]bis[3,5-dimethylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 2,2'-[(3-hydroxy-4-methoxyphenyl)methylene]bis[3,5-dimethylphenol], 4,4'-[(2-hydroxyphenyl)methylene]bis[2-methylethylphenol], 4,4'-[(3-hydroxyphenyl)methylene]bis[2-methylethylphenol], 4,4'-[(4-hydroxyphenyl)methylene]bis[2-methylethylphenol], 2,2'-[(3-hydroxyphenyl)methylene]bis[3,5,6-trimethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(3-hydroxy-4-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(3-hydroxy-4-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'-[(2-hydroxyphenyl)methylene]bis[2-cyclohexylphenol], 4,4'-[(3-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(3-hydroxy-4-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis

[3,5-dimethylphenol], 4,4'-[(3,4-dihydroxyphenyl) methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis [2-cyclohexylphenol], 3,3'-[(2-hydroxyphenyl)methylene] bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol, 4,4'-(3,5-dimethyl-4-hydroxyphenylmethylene)-bis(2,6-dimethylphenol), 3,3-bis(p-dimethylaminophenyl)-6-dimethylaminophthalide, 3,6-bis(dimethylamino)fluorane-γ-(4'-nitro)-aminolactam, 2-(2-chloroanilino)-6-diethylaminofluorane, 2-(2-chloroanilino)-6-dibutylaminofluorane, 2-N,N-dibenzylamino-6-diethyl aminofluorane, 6-diethylamino-benzo [a]-fluorane, 2,2'-bis (2-chlorophenyl)-4,4',5,5'-tetraphenyl-1,2'-bi (imidazole), 1,3-diemthyl-6-diethylaminofluorane, 2-anilino-3-methyl-6-dibutylaminofluorane, 3,7-bis(dimethylamino)-10-benzoylphenothiazine, 3-diethylamino-6-chloro-7-(β-ethoxyethylamino)fluorane, 3-diethylamino-6-methyl-7-anilinofluorane, 3-triethylamino-6-methyl-7-anilinofluorane and 3-cyclohexylamino-6-methyl-7-anilinofluorane.

As the (c) component, the hydroxyl group-containing compounds having triarylmethane skeleton, represented by the following formula (11) or (12) are preferred:

Preferred examples of the compounds represented by the above-described formulae (11) and (12) include 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl) methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis (4-hydroxyphenyl)methyl]-2-ethoxyphenol, 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene] bis[2,3,6-trimethylphenol], 4,4'-[(2-hydroxyphenyl) methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl) methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4'"-(1,2-ethanediylidene)tetrakisphenol, 4,4',4",4'"-(1,2-ethanediylidene)tetrakis[2-methylphenol], 4,4',4",4'"-(1,2-ethanediylidene)tetrakis[2,6-dimethylphenol], 4,4',4",4'"-(1,4-phenylenedimethylidene)tetrakisphenol, 4,4',4",4'"-(1,4-

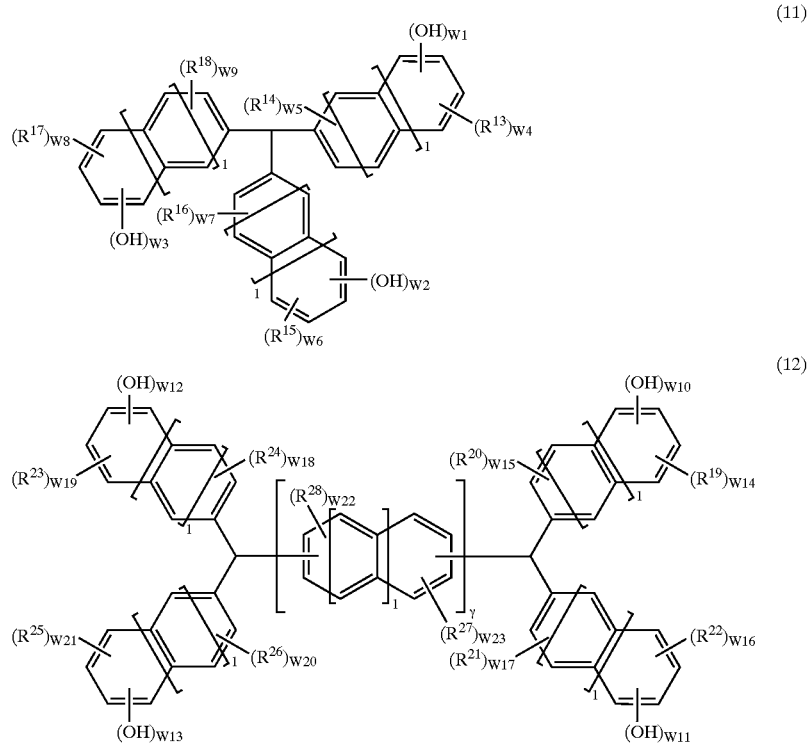

In formulae (11) and (12), $R^{13}$ to $R^{28}$ independently represent hydrogen, $C_1$–$C_{12}$ hydrocarbon group, $C_3$–$C_8$ alicyclic group, $C_6$–$C_{15}$ hydrocarbon group containing aromatic ring (s) or $C_1$–$C_4$ alkoxyl group; 1 represents an integer of 0 or 1, preferably 0; γ represents an integer of 0 to 3, preferably 1; w1 to w23 independently represent integers of 0 to 4; w1+w2+w3>0 and w10+w11+w12+w13>0.

phenylenedimethylidene)tetrakis(2,6-dimethylphenol), 4,4'-[(2-hydroxyphenyl)methylene]bis[3-methylphenol], 4,4'-[(2-hydroxy-3-methoxyphenyl)methylene]bis[2,5-dimethylphenol], 4,4'-[(2-hydroxy-3-methoxyphenyl) methylene]bis[2,6-dimethylphenol], 2,2'-[(2-hydroxy-3-methoxyphenyl)methylene]bis[3,5-dimethylphenol], 4,4'-[(2-hydroxyphenyl)methylene]bis[2-methylethylphenol], 4,4'-[(4-hydroxyphenyl)methylene]bis[2-methylethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'-[(2-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4''-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol and 4,4'-(3,5-dimethyl-4-hydroxyphenylmethylene)-bis(2,6-dimethylphenol). These hydroxyl group-containing compounds having triarylmethane skeleton are especially preferred because the temperatures at which the compounds color are high and the compounds have excellent heat resistances. The hydroxyl group-containing compounds having triarylmethane skeleton may be used as the quinone diazide compounds after esterifying the compounds with naphthoquinone diazide sulfonic acid.

The content of the (c) heatsensitive compound may preferably be 1 to 300 parts by weight, more preferably 10 to 200 parts by weight per 100 parts by weight of the (a) alkali-soluble resin. If the content of the (c) heatsensitive compound exceeds 300 parts by weight per 100 parts by weight of the (a) alkali-soluble resin, the resin content is small, so that the adhesion of the resin film with the substrate may be degraded.

The (d) component used in composition of the present invention is a compound which does not have an absorption maximum at a wavelength of not less than 350 nm to less than 500 nm, and has an absorption maximum at a wavelength of not less than 500 nm and not more than 750 nm. As the (d) component, a dye and/or a pigment may preferably be used. As the (d) component, at least one compound is used. For example, (1) one dye or one organic pigment may be used, (2) two or more dyes may be used in combination or two or more organic pigments may be used in combination, or (3) two or more dyes and two or more organic pigments may be used in combination.

As the dyes to be used as the (d) component, the dyes which are soluble in the organic solvent which dissolves the (a) alkali-soluble resin, and which are miscible with the organic solvent, are preferred. Preferred dyes include oil-soluble dyes, disperse dyes, reactive dyes, acid dyes and direct dyes. Preferred dyes in terms of skeletons thereof include anthraquinone-based, azo-based, phthalocyanine-based, methine-based and oxazine-based dyes, as well as these dyes just mentioned above which further contain metal complex salts. Among these dyes, phthalocyanine-based dyes and phthalocyanine-based dyes containing metal complex salts are especially preferred. The above-mentioned dyes are preferred because they are excellent in heat resistance and light resistance. Examples of these dyes include Sumilan, and Lanyl Dyes (trademarks, commercially available from Sumitomo Chemical Industry Co., Ltd.); Orasol, Oracet, Filamid, and Irgasperse Dyes (trademarks, commercially available from Chiba Specialty Chemicals Co., Ltd.); Zapon, Neozapon, Neptune, and Acidol Dyes (trademarks, commercially available from BASF); Kayaset, and Kayakalan Dyes (trademarks, commercially available from Nippon Kayaku Co., Ltd.); Valifast colors Dye (trademark, commercially available from Orientchemcial Co., Ltd.); Savinyl, Sandoplast, Polysynthren, and Lanasyn Dyes (trademarks, commercially available from Clariant Japan Co., Ltd.); and Aizen Spilon Dye (trademark, commercially available from Hodogaya Chemical Co., Ltd). These dyes may be used individually, or two or more of these dyes may be used in combination.

As the organic pigments which may be used as the (d) component, those pigments which have high heat resitances and high light resistances are preferred. Examples of the organic pigments which may be used in the present invention are described below in terms of color index (CI) numbers. Examples of violet pigments include Pigment Violet 19, 23, 29, 32, 33, 36, 37 and 38. Examples of blue pigments include Pigment Blue 15 (15:3, 15:4, 15:6 and the like), 21, 22, 60 and 64. Examples of the green pigments include Pigment Green 7, 10, 36 and 47. Pigments other than those mentioned above may also be employed.

The content of the (d) compound may preferably be 1 to 300 parts by weight, more preferably 10 to 200 parts by weight per 100 parts by weight of the (a) alkali-soluble resin. If the content of the (d) compound exceeds 300 parts by weight per 100 parts by weight of the (a) alkali-soluble resin, the resin content is small, so that the adhesion of the resin film with the substrate may be degraded.

The organic pigments may be subjected to a surface treatment such as rosin treatment, acidic group treatment or basic group treatment as required. The organic pigments may be used together with a dispersant. As the dispersant, cationic surfactants, anionic surfactants, nonionic surfactants, amphoteric surfactants, silicone-based surfactants and fluorine-contained surfactants may be used.

To improve the wetting property between the positive-type photosensitive resin composition and the substrate, surfactants; esters such as propylene glycol monomethyl ether acetate, ethylene glycol monoethyl ether acetate, 3-methoxybutyl acetate and 3-methyl-3-methoxybutyl acetate; alcohols such as 3-methyl-2-butanol and 3-methyl-3-methoxybutanol; ketones such as cyclohexanone; and ethers such as tetrahydrofuran and dioxane may be added to the resin composition. Further, inorganic particles such as silicon dioxide and titanium dioxide; and powder of polyimide may be added to the resin composition. The above-mentioned additives may be employed individually, or two or more of the additives may be employed in combination.

To promote the adhesion between the resin composition and the substrate such as silicon wafer, ITO substrate or $SiO_2$, a silane coupling agent or titanium chelating agent may be added to the photosensitive composition in the form of varnish in an amount of 0.005 to 10% by weight.

Alternatively, the substrate may be pretreated with the solution of the silane coupling agent or titanium chelating agent.

In cases where the silane coupling agent or titanium chelating agent is added to the varnish, a silane coupling agent such as methylmethacryloxydimethoxysilane or 3-aminopropyltrimethoxysilane, a titanium chelating agent, or aluminum chelating agent may be added to the varnish in an amount of 0.005 to 10% by weight based on the weight of the polymer in the varnish. These additives may be used individually or two or more of the additives may be used in combination.

In cases where the substrate is treated with the above-mentioned silane coupling agent, the silane coupling agent is dissolved in a solvent such as isopropanol, ethanol, methanol, water, tetrahydrofuran, propylene glycol monomethyl ether acetate, propylene glycol monomethyl ether, methyl lactate or diethyl adipate to a concentration of 0.5 to 20% by weight, and the solution is applied to the surface of the substrate by spin coating, slit-die coating, bar coating, dip coating, spray coating method or by vapor treatment. In some cases, the reaction between the substrate and the coupling agent may be carried out by heating the substrate to 50° C. to 300° C.

To apply the photosensitive composition according to the present invention on a substrate, a liquid composition (varnish) is prepared by dissolving or dispersing the above-described components in a solvent. Preferred examples of the solvent include organic solvents which dissolve the alkali-soluble resin of the (a) component, such as propylene glycol monomethyl ether acetate, propylene glycol monomethyl ether, propylene glycol monoethyl ether, propylene glycol monopropyl ether, propylene glycol monobutyl ether, γ-butyrolactone, N-methyl-2-pyrrolidone, 3-methyl-3-methoxybutyl acetate, 3-methyl-3-methoxybutanol, ethyl lactate and diacetone alcohol, but the organic solvents are not restricted thereto. These solvents may be used individually or two or more solvents may be used in combination. The solid content in the varnish is not restricted, and may usually be about 5 to 50% by weight, preferably 10 to 40% by weight based on the total weight of the composition.

A method for forming a pattern made of the heat-resistant resin using the photosensitive composition according to the present invention will now be described.

First, a substrate is coated with the photosensitive composition. The substrate may be made of any material on which the metal electrode can be formed, such as metal, glass, semiconductor, metal oxide insulation film, silicon nitride, polymer film or the like. As the substrate, a glass is preferably employed. The glass is not restricted, and alkali zinc borosilicate glass, sodium borosilicate glass, soda lime glass, low-alkali borosilicate glass, barium borosilicate glass, borosilicate glass, aluminosilicate glass, fused quartz glass, synthetic quartz glass or the like may be employed. Usually, no-alkali glass or soda lime glass having a barrier coat made of $SiO_2$ or the like, with which the amount of the ions leaked from the glass is small, is employed. The thickness of the substrate is not restricted as long as the appropriate mechanical strength is obtained, and may be not less than 0.1 mm, preferably not less than 0.5 mm. The photosensitive resin composition may be applied to the substrate by slit die coating method, spin coating method, spray coating method, roll coating method, bar coating method or the like. These methods may be employed in combination. Among these coating methods, slit die coating method is preferred. The coating thickness of the composition varies depending on the method of coating, solid content of the composition, viscosity or the like, and the composition is usually applied to attain a coating thickness after drying of 0.1 μm to 100 μm.

Next, the substrate coated with the photosensitive resin composition is dried to form the coating film of the photosensitive resin composition. The drying may be attained by using a hot plate, oven, infrared, vacuum chamber or the like.

In cases where a hot plate is used, the substrate coated with the composition may be heated while being directly placed on the hot plate, or while being held above the hot plate using a jig such as proxy pins. Commercially available proxy pins are made of metals such as aluminum and stainless steel, or made of synthetic resins such as polyimide resins and Teflon (trademark), and any of these proxy pins may be employed. The heights of the proxy pins vary depending on the size of the substrate, the type of the resin layer to be heated, the purpose of heating and the like, and for example, when heating the resin coating layer formed on a glass substrate sizing 300 mm×350 mm×0.7 mm, the height of the proxy pins may preferably be about 2 to 12 mm.

The heating temperature varies depending on the type of the coating resin film to be heated and the purpose of heating, and heating may preferably be carried out at room temperature to 180° C. for 1 minute to several hours.

The thus formed photosensitive resin coating film is then exposed to actinic radiation through a photomask having a desired pattern. The actinic ray used for the exposure may be UV light, visible light, electron beam, X-ray or the like. In the present invention, i-line (365 nm), h-line (405 nm) and g-line (436 nm) from a mercury lamp are preferred.

After the exposure, the exposed coating film is then developed with a developer so as to remove the exposed regions, thereby forming the desired pattern of the coating film. As the developer, an aqueous alkaline solution may preferably be employed. Preferred examples of the developer include aqueous solutions of alkaline compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine. The pH of the developer is usually adjusted to not less than 10 and not more than 14. To the aqueous alkali solution mentioned above, one or more of solvents may be added. Examples of the solvents include polar solvents such as N-methyl-2-pyrrolidone, N,N-dimethylformamide, N,N-dimethylacetamide, dimethylsulfoxide, γ-butyrolactone and dimethyl acrylamide; alcohols such as methanol, ethanol and isopropanol; esters such as ethyl lactate and propylene glycol monomethyl ether acetate; and ketones such as cyclopentanone, cyclohexanone, isobutyl ketone and methylisobutyl ketone. These solvents may be added individually or two or more of the solvents may be added in combination.

After the development, the coating film is then rinsed with water. Here, similarly, one or more of alcohols such as ethanol and isopropanol; and esters such as ethyl lactate and propylene glycol monomethyl ether acetate may be added to the water.

After the development, the coating film is then converted to heat-resistant resin film by heating the film in the air or in nitrogen atmosphere usually at 130° C. to 350° C. As the atmosphere in which the heat treatment is carried out, air is preferred because coloring of the heatsensitive compound may usually be accelerated by oxidation reaction with the oxygen in the air. The heat treatment may be carried out usually for 5 minutes to 5 hours, such that several temperatures are selected and the temperature is raised stepwise attaining the selected temperatures; or such that the temperature is continuously raised within the selected range. Thus, for example, the heat treatment may be carried out at 130° C. for 30 minutes, then at 200° C. for 30 minutes, and then at 350° C. for 30 minutes. Alternatively, for example, the heat treatment may be carried out by linearly raising the temperature from room temperature to 250° C. for 2 hours, or from room temperature to 350° C. for 2 hours.

The optical density (O.D) of the heat-resistant resin coating film with a thickness of 1.0 μm obtained after the heat treatment of the photosensitive resin composition according to the present invention is preferably not less than 0.3, more preferably not less than 0.5. If the optical density is less than 0.3, the contrast between the luminescent area and non-luminescent area of the display using the coating film is not promoted, so that it may be difficult for the coating film to function as a light-blocking separator or black matrix of an organic EL device or liquid crystal display device.

With the heat-resistant coating film obtained by heat-treating the photosensitive resin composition according to the present invention, the optical density after irradiation with light for 500 hours using a xenon fade meter is not less than 50% of the optical density before the irradiation (that is, the optical density-retaining ratio is not less than 50%). The optical-density retaining ratio is less than 50% if the (d) component is not contained. If the optical-density retaining ratio is less than 50%, the light resistance is not sufficient, and the degradation of the quality of the display may likely be prominent due to the lowering of the optical density of the insulation layer from the initial optical density after use for a long period, so that it may be difficult for the coating film to function as a light-blocking separator or black matrix of an organic EL device or liquid crystal display device. The optical-density retaining ratio is preferably not less than 50%, more preferably not less than 70%, still more preferably not less than 90%. The method for determining the optical-density retaining ratio is described below.

As shown in FIG. 1, when the heat-resistant coating film as an insulation layer 3 is formed on a substrate 5, the cross-section of the insulation layer 3 at the boundary with the first electrode 4 is preferably "forward-tapered". The term "forward-tapered" herein means that the angle θ shown in FIG. 1 is less than 90°. The angle θ may preferably not more than 60°, more preferably not more than 45°, still more preferably not more than 30°. If the angle θ is larger than 60°, the thin layer 2 and the second electrode 1 tend to be thin at the boundary (i.e., the end) of the insulation layer, so that irregularity in brightness in the luminescent region may be likely to occur. Further, after driving for a long time, water and a small amount of gas may invade from the interface between the insulation layer and the adjacent layer, which may cause enlargement of the dark area. Still further, electric field center may be formed at the edge portion of the electrode, so that undesirable phenomena such as dielectric breakdown and generation of leak current are likely to occur at the edge portion of the electrode.

The present invention will now be described in more detail by way of preferred examples thereof and comparative examples.

In the examples and comparative examples below, the optical density, light resistance, shape of cross-section and luminescent characteristic were evaluated by the following methods:

(1) Evaluation of Optical Density

Optical density (O.D) was defined according to the equation:

$$O.D = \log_{10}(I_0/I)$$

wherein $I_0$ means the intensity of incident light in the visible region of a wavelength from 430 nm to 640 nm, and I means the intensity of the transmitted light, the intensities of light being measured by using a microspectroscope ("MCPD2000" commercially available from Otsuka Electronics Co., Ltd., Japan).

(2) Evaluation of Light Resistance

Using a xenon long-life fade meter commercially available from Suga Test Instruments Co., Ltd., Japan, a heat-resistant resin film formed on a non-alkali glass after heat treatment was exposed to light from a xenon arc lamp after passing through a polarizing filter with a transmission of 45%, at an illumination of 72,000 lux for 500 hours, and the optical densities before and after the exposure were measured. The optical density-retaining ratio (r) was calculated in accordance with the following equation:

$$r(\%) = O.D_2/O.D_1 \times 100$$

wherein $O.D_1$ means the optical density before the light exposure, and $O.D_2$ means the optical density after the light exposure.

(3) Evaluation of Shape of Cross-Section

The cross-section of a 201 m patterned line formed with a heat resistant resin coating film after heat treatment was observed with a scanning electron microscope ("S-4800", commercially available from Hitachi High-Technologies Co., Ltd.), and the angle θ shown in FIG. 1 was measured.

(4) Evaluation of Durability of Luminescence

An organic electroluminescent device of simple matrix type was prepared. The device was illuminated at a relative humidity of 85% and retained under this condition for 250 hours. The ratio of effective luminescent area (S) was calculated in accordance with the following equation:

$$S(\%) = (S_2/S_1) \times 100$$

wherein $S_1$ means the initial effective luminescent area and $S_2$ means the effective luminescent area after retaining the device for 250 hours.

SYNTHESIS EXAMPLE 1

Synthesis of Hydroxyl Group-Containing Acid Anhydride (A)

Under dry nitrogen gas flow, 18.3 g (0.05 mol) of 2,2-bis (3-amino-4-hydroxyphenyl)hexafluoropropane (BAHF) and 34.2 g (0.3 mol) of allylglycidyl ether were dissolved in 100 g of γ-butyrolactone, and the resulting mixture was cooled to −15° C. To this mixture, 22.1 g (0.11 mol) of anhydrous trimellitic chloride dissolved in 50 g of γ-butyrolactone was added dropwise such that the temperature of the reaction mixture did not exceed 0° C. After completion of the dropping, the resulting mixture was reacted at 0° C. for 4 hours. This solution was concentrated in a rotary evaporator, and the resultant was added to 1 L of toluene to obtain an acid anhydride (A).

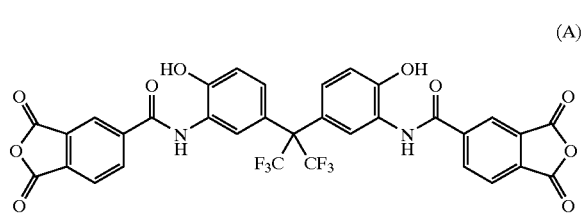

(A)

SYNTHESIS EXAMPLE 2

Synthesis of Hydroxyl Group-Containing Diamine Compound (B)

In 50 ml of acetone and 30 g (0.34 mol) of propylene oxide, 15.4 g (0.1 mol) of 2-amino-4-nitrophenol was dissolved, and the mixture was cooled to −15° C. To this mixture, 17.8 g (0.055 mol) of 2,2-bis(4-benzoyl chloride) propane dissolved in 60 ml of acetone was slowly added dropwise. After completion of the dropping, the resulting reaction mixture was allowed to react at −15° C. for 4 hours. The reaction mixture was allowed to warm to room temperature, and the generated precipitates were recovered by filtration.

The precipitates were dissolved in 200 ml of γ-butyrolactone and 3 g of 5% palladium-carbon was added thereto, followed by vigorous stirring of the resulting mixture. A hydrogen gas balloon was attached to the reaction vessel to supply hydrogen gas to the reaction mixture. The stirring of the reaction mixture was continued at room temperature until the balloon did not shrink any more, and the reaction mixture was stirred for another 2 hours under the condition that the hydrogen gas balloon was attached. After the stirring, the palladium compound was removed by filtration, and the solution was concentrated in a rotary evaporator until the volume of the solution became half of the original volume. Ethanol was added to the obtained concentrate and recrystallization was performed to obtain the desired compound.

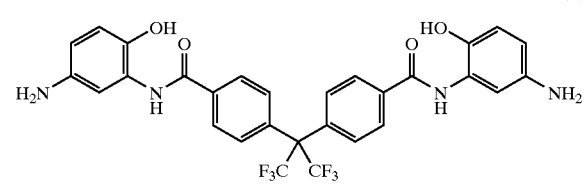

(B)

SYNTHESIS EXAMPLE 3

Synthesis of Hydroxyl Group-Containing Diamine Compound (C)

In 100 ml of acetone and 17.4 g (0.3 mol) of propylene oxide, 18.3 g (0.05 mol) of BAHF was dissolved and the mixture was cooled to −15° C. To this mixture, 20.4 g (0.11 mol) of 4-nitrobenzoyl chloride dissolved in 100 ml of acetone was slowly added dropwise. After the dropping, the mixture was allowed to react at −15° C. for 4 hours, and then the mixture was allowed to warm to room temperature. The precipitated white solid was separated by filtration and dried in vacuum at 50° C.

The thus obtained 30 g of solid was placed in a 300 ml stainless steel autoclave, and dispersed in 250 ml of methyl cellosolve, followed by addition of 2 g of 5% palladium-carbon. After attaching a hydrogen gas balloon to the reaction vessel, reduction reaction was carried out at room temperature. After about 2 hours, it was confirmed that the balloon did not shrink any more, and the reaction was completed. After completion of the reaction, the palladium compound used as a catalyst was removed by filtration, and the resultant was concentrated in a rotary evaporator to obtain a diamine compound (C). The obtained solid was used for the reaction.

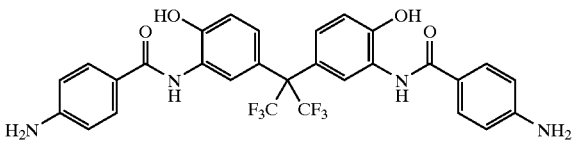

(C)

SYNTHESIS EXAMPLE 4

Synthesis of Hydroxyl Group-Containing Diamine Compound (D)

In 100 ml acetone and 17.4 g (0.3 mol) of propylene oxide, 15.4 g (0.1 mol) of 2-amino-4-nitrophenol was dissolved and the mixture was cooled to −15° C. To this mixture, 20.4 g (0.11 mol) of 4-nitrobenzoyl chloride dissolved in 100 ml of acetone was slowly added dropwise. After the dropping, the mixture was allowed to react at −15° C. for 4 hours, and then the mixture was allowed to warm to room temperature. The precipitated white solid was separated by filtration. Thereafter, the same operations as in Synthesis Example 2 were carried out to obtain the desired compound.

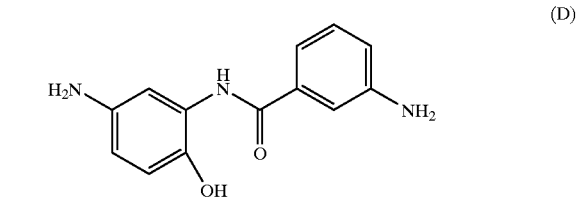

(D)

SYNTHESIS EXAMPLE 5

Synthesis of 3,3',4,4'-diphenylether tetracarboxylic acid di-n-butyl ester dichloride solution (E)

Under nitrogen gas flow, 24.82 g (0.08 mol) of 3,3',4,4'-diphenylether tetracarboxylic dianhydride and 59.3 g (0.8 mol) of n-butyl alcohol were reacted at 95° C. for 6 hours. The excess n-butyl alcohol was evaporated under reduced pressure to obtain 3,3',4,4'-diphenylether tetracarboxylic acid di-n-butyl ester. Then 95.17 g (0.8 mol) of thionyl chloride and 70 g of tetrahydrofuran (THF) were added, and the resulting mixture was allowed to react at 40° C. for 3 hours. Then 200 g of N-methylpyrrolidone was added and excess thionyl chloride and THF were removed under reduced pressure to obtain 239.6 g (0.08 mol) of 3,3',4,4'-diphenylether tetracarboxylic acid di-n-butyl ester dichloride solution (E).

SYNTHESIS EXAMPLE 6

Synthesis of Quinone Diazide Compound (F)

Under dry nitrogen gas flow, 21.23 g (0.05 mol) of Tris P-PA (trademark, commercially available from Honshu Chemical Industry Co., Ltd.) and 33.58 g (0.125 mol) of 5-naphthoquinone diazide sulfonyl chloride were dissolved in 450 g of 1,4-dioxane, and the temperature of the the mixture was allowed to become to room temperature. A mixture of 50 g of 1,4-dioxane and 12.65 g (0.125 mol) of triethylamine was added thereto dropwise such that the temperature of the reaction mixture was not raised to 35° C. or higher. After the dropping, the mixture was stirred at 30° C. for 2 hours. The triethylamine salt was removed by filtration, and the filtrate was poured into water. The formed precipitates were recovered by filtration and dried in a vacuum dryer to obtain a quinone diazide compound (F).

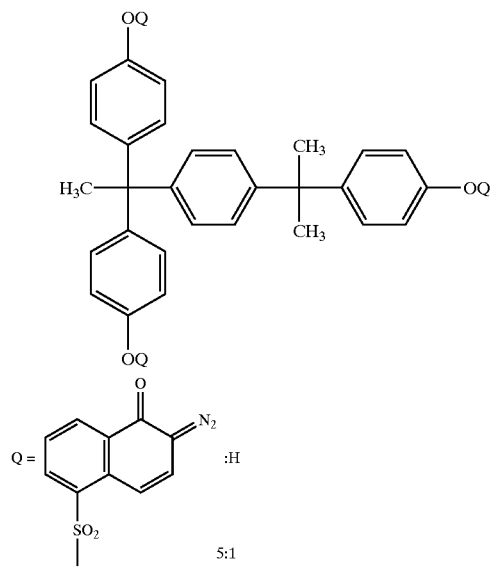

SYNTHESIS EXAMPLE 7

Synthesis of Quinone Diazide Compound (G)

Under dry nitrogen gas flow, 6.81 g (0.05 mol) of 4-isopropylphenol and 13.43 4 g (0.05 mol) of 5-naphthoquinone diazide sulfonyl chloride were dissolved in 450 g of 1,4-dioxane, and the temperature of the mixture was allowed to become to 15 room temperature. Using a mixture of 50 g of 1,4-dioxane and 5.06 g of triethylamine, the same operations as in Synthesis Example 6 were carried out to obtain Quinone diazide compound (G).

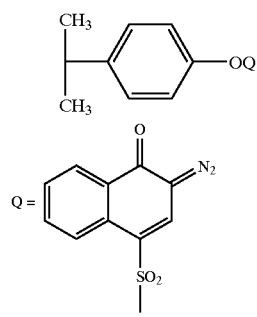

SYNTHESIS EXAMPLE 8

Synthesis of Quinone Diazide Compound (H)

Under dry nitrogen gas flow, 11.41 g (0.05 mol) of bisphenol A and 26.86 g (0.1 mol) of 5-naphthoquinone diazide sulfonyl chloride were dissolved in 450 g of 1,4-dioxane, and the temperature of the mixture was allowed to become to room temperature. Using a mixture of 50 g of 1,4-dioxane and 10.12 g of triethylamine, the same operations as in Synthesis Example 6 were carried out to obtain Quinone diazide compound (H).

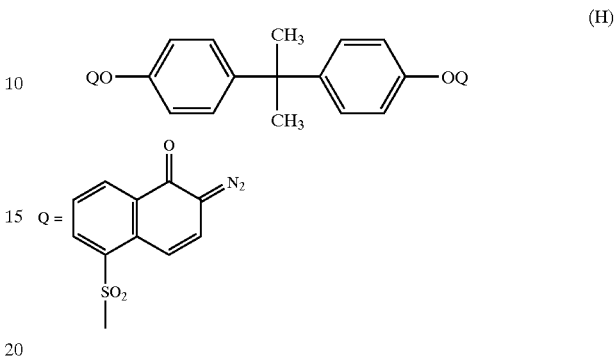

SYNTHESIS EXAMPLE 9

Synthesis of Active Ester Compound (I)

Under dry nitrogen gas flow, 18.5 g (0.1 mol) of 4-carboxybenzoic chloride and 13.5 g (0.1 mol) of hydroxybenzotriazole were dissolved in 100 g of tetrahydrofuran (THF), and the mixture was cooled to −15° C. To this mixture, 10 g (0.1 mol) of triethylamine dissolved in 50 g of THF was added dropwise such that the temperature of the reaction solution did not exceed 0° C. After the dropping, the mixture was allowed to react at 25° C. for 4 hours. This solution was concentrated in a rotary evaporator to obtain the active ester compound (I).

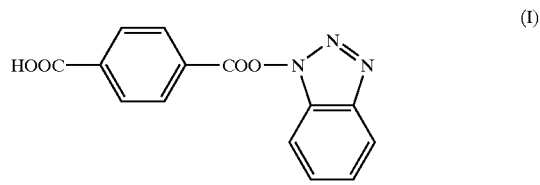

SYNTHESIS EXAMPLE 10

Synthesis of Alkali-Soluble Polymer (J)

Under dry nitrogen gas flow, 9.61 g (0.016 mol) of the hydroxyl group-containing acid anhydride (A) was dissolved in 100 g of N-methyl-2-pyrrolidone (NMP). To this solution, 12 g (0.02 mol) of hydroxyl group-containing diamine (B) was added together with 25 g of NMP, and the resulting mixture was allowed to react at 20° C. for 1 hour and then at 50° C. for 2 hours. Thereafter, 0.78 g (0.008 mol) of maleic anhydride as an end cap compound was added and the mixture was allowed to react at 50° C. for 2 hours. Then a solution of 7.15 g (0.06 mol) of N,N-dimethylformamide dimethylacetal diluted with 10 g of NMP was added dropwise for 10 minutes. After the dropping, the resulting mixture was stirred at 50° C. for 3 hours. After completion of the reaction, the reaction solution was poured into IL of water, and the precipitates of the polymer solid were recovered by filtration. The polymer solid was dried at 80° C. for 40 hours in a vacuum dryer to obtain the alkali-soluble polymer (J).

SYNTHESIS EXAMPLE 11

Synthesis of Alkali-Soluble Polymer (K)

Under dry nitrogen gas flow, 12.01 g (0.02 mol) of the hydroxyl group-containing acid anhydride (A) was dissolved in 100 g of N-methyl-2-pyrrolidone (NMP). To this solution, 4.84 g (0.008 mol) of hydroxyl group-containing diamine (C) and 1.94 g (0.008 mol) of hydroxyl group-containing diamine (D) were added together with 25 g of NMP, and the resulting mixture was allowed to react at 20° C. for 1 hour and then at 50° C. for 2 hours. Then 0.94 g (0.008 mol) of 4-ethinylaniline was added, and the reaction mixture was allowed to react at 50° C. for 2 hours. Then a solution of 7.15 g (0.06 mol) of N,N-dimethylformamide dimethylacetal diluted with 5 g of NMP was added dropwise for 10 minutes. After the dropping, the resulting mixture was stirred at 50° C. for 3 hours. After completion of the reaction, the reaction solution was poured into 1 L of water, and the precipitates of the polymer solid were recovered by filtration. The polymer solid was dried at 80° C. for 40 hours in a vacuum dryer to obtain the alkali-soluble polymer (K).

SYNTHESIS EXAMPLE 12

Synthesis of Alkali-Soluble Polymer (L)

Under dry nitrogen gas flow, 9.67 g (0.016 mol) of the hydroxyl group-containing diamine (C), 1.86 g (0.0075 mol) of 1,3-bis(3-aminopropyl)tetramethyldisiloxane and 0.94 g (0.008 mol) of 4-ethylaniline as an end cap compound were dissolved in 50 g of N-methyl-2-pyrrolidone (NMP). To this solution, 6.2 g (0.02 mol) of bis(3,4-dicarboxyphenyl)ether dianhydride was added together with 14 g of NMP, and the resulting mixture was allowed to react at 20° C. for 1 hour and then at 50° C. for 4 hours. Then a solution of 7.15 g (0.06 mol) of N,N-dimethylformamidedimethyl acetal diluted with 5 g of NMP was added dropwise for 10 minutes. After the dropping, the resulting mixture was stirred at 50° C. for 3 hours. After completion of the reaction, the reaction solution was poured into 1L of water, and the precipitates of the polymer solid were recovered by filtration. The polymer solid was dried at 70° C. for 60 hours in a vacuum dryer to obtain the alkali-soluble polymer (L).

SYNTHESIS EXAMPLE 13

Synthesis of Alkali-Soluble Polymer (M)

Under dry nitrogen gas flow, 6.2 g (0.02 mol) of bis(3, 4-dicarboxyphenyl)ether dianhydride was dissolved in 50 g of N-methyl-2-pyrrolidone (NMP). To this solution, 1.09 g (0.01 mol) of 3-aminophenol as an end cap compound was added, and the mixture was allowed to react at 40° C. for 1 hour. Then 4.23 g (0.007 mol) of the hydroxyl group-containing diamine (C) was added together with 10 g of NMP, and the resulting mixture was allowed to react at 40° C. for 2 hours. Then a solution of 5.96 g (0.05 mol) of N,N-dimethylformamide dimethylacetal diluted with 5 g of NMP was added dropwise for 10 minutes. After the dropping, the resulting mixture was stirred at 50° C. for 3 hours. After completion of the reaction, the reaction solution was poured into 1L of water, and the precipitates of the polymer solid were recovered by filtration. The polymer solid was dried at 70° C. for 60 hours in a vacuum dryer to obtain the alkali-soluble polymer (M).

SYNTHESIS EXAMPLE 14

Synthesis of Alkali-Soluble Polymer (N)

Under dry nitrogen gas flow, 18.68 g (0.051 mol) of 2,2-bis(3-amino-4-hydroxyphenyl)hexafluoropropane, 1.86 g (0.0075 mol) of 1,3-bis(3-aminopropyl)tetramethyldisiloxane, 9.62 g (0.034 mol) of the active ester compound (I) as an end cap compound, and 11.93 g (0.151 mol) of pyridine were dissolved in 50 g of N-methyl-2-pyrrolidone (NMP). To this mixture, 239.6 g (0.08 mol) of 3,3',4,4'-diphenylether tetracarboxylic acid di-n-butyl ester dichloride solution (E) was added dropwise such that the temperature of the reaction mixture was not raised to 10° C. or higher. After the dropping, the mixture was stirred at room temperature for 6 hours. After completion of the reaction, the reaction solution was poured into 2L of water, and the precipitates of the polymer solid were recovered by filtration. The polymer solid was dried at 80° C. for 20 hours in a vacuum dryer to obtain the alkali-soluble polymer (N).

SYNTHESIS EXAMPLE 15

Synthesis of Alkali-Soluble Polymer (P)

Under dry nitrogen gas flow, 7.75 g (0.051 mol) of 3,5-diaminobenzoic acid, 4 g (0.02 mol) of 4,4'-diaminodiphenyl ether, 1.96 g (0.018 mol) of 3-aminophenol as an end cap compound, and 12.6 g (0.16 mol) of pyridine were dissolved in 50 g of N-methyl-2-pyrrolidone (NMP). To this mixture, 239.6 g (0.08 mol) of 3,3',4,4'-diphenylether tetracarboxylic acid di-n-butyl ester dichloride solution (E) was added dropwise such that the temperature of the reaction mixture was not raised to 10° C. or higher. After the dropping, the mixture was stirred at room temperature for 6 hours. After completion of the reaction, the reaction solution was poured into 2L of water, and the precipitates of the polymer solid were recovered by filtration. The polymer solid was dried at 80° C. for 20 hours in a vacuum dryer to obtain the alkali-soluble polymer (P).

EXAMPLE 1

In 264 g of methylisobutyl ketone, 57 g (0.6 mol) of m-cresol, 38 g (0.4 mol) of p-cresol, 75.5 g (formaldehyde 0.93 mol) of 37 wt % aqueous formaldehyde solution and 0.63 g (0.005 mol) of oxalic acid dihydrate were dissolved, and polycondensation reaction was carried out under reflux and under stirring for 4 hours. The resultant was heated for 3 hours and then the pressure in the flask was reduced to 4000–6666 Pa to remove volatiles. The melted resin was recovered after cooling the mixture to room temperature. The obtained resin was dissolved in ethyl acetate to a concentration of the resin component of 30% by weight. To this solution, methanol in an amount of 1.3 times the weight of the solution and water in an amount of 0.9 times the weight of the solution were added, and the resulting mixture was stirred. After the mixture was separated into two layers, the lower layer was recovered, concentrated and dried to obtain a novolak resin.

To 100 parts by weight of the thus obtained novolak resin, 30 parts by weight of a condensation product between 1 mole of 4,4'-1-[4-[1-[4-hydroxyphenyl]-1-methylethyl]phenyl]ethylidene]bisphenol and 2 moles of 1,2-naphthoquinone diazide-5-sulfonyl chloride, 25 parts by weight of 4,4',4"-tris(dimethylamino)triphenylmethane (absorption maximum: 600 nm) as a heatsensitive compound, 35 parts by weight of Pigment Blue 15:6 (Phthalocyanine Blue E, absorption maximum: 670 nm), 2 parts by weight of an urethane-based dispersant (trademark "Disperbyk-182") and 5 parts by weight of γ-methacryloxypropyltrimethoxysilane were added, and the resulting mixture was dissolved in propylene glycol monomethyl ether acetate to a concentration of solid components of 25% by weight, thereby obtaining a positive-type photosensitive resin composition (varnish A1).

A glass substrate sizing 300 mm×350 mm comprising an ITO transparent electrode film with a thickness of 130 nm prepared by sputtering vapor deposition method on the surface of a non-alkali glass plate sizing 300 mm×350 mm×0.7 mm (#1737 commercially available from Corning Japan Co., Ltd.) was prepared. A photoresist was applied to the ITO substrate by spin coating method, and the ITO layer was patterned by a conventional photolithography method including exposure and development. The unnecessary portions of the ITO layer were removed by etching, and then the photoresist was removed, thereby patterning the ITO layer into a stripe, each line having a length of 90 mm and a width of 80 $\mu$m. The pitch of the thus obtained stripe-shaped first electrode was 100 $\mu$m.

To the glass substrate on which the patterned ITO layer was formed, the varnish A1 was applied by slit die coating method or spin coating method to a thickness after soft baking of 1.5 $\mu$m. The rate of coating was 3 m/min. When the spin coating method was used, the revolution was adjusted so as to attain the thickness of the coating film after soft baking of 1.5 $\mu$m. Thereafter, the glass substrate was retained at a height of 5 mm from the hot plate ("EA-4331" commercially available from Chuoriken Co., Ltd., Japan) using proxy pins, and then heated at 90° C. for 3 minutes to obtain a positive-type photosensitive coating film. The thus formed coating film of varnish A1 was exposed to UV through a photomask, and the exposed regions alone were dissolved in 2.38% aqueous trimethyl ammonium hydroxide (TMAH) solution, thereby developing the coating film, followed by rinsing the resultant with pure water. The obtained resin pattern was cured by heating the obtained resin pattern in the air in a clean oven at 220° C. for 60 minutes, thereby forming an insulation layer such that the insulation layer covers the edge of the first electrode. The thickness of the insulation layer was about 1 $\mu$m. A light-blocking insulation layer made of the photosensitive novolak resin, in which the central portion of the first electrode is exposed through an opening with a width of 70 $\mu$m and a length of 250 $\mu$m, which light-blocking insulation layer covers the edge of the first electrode, was formed. The O.D of the insulation layer was 0.5. The cross-section of the boundary portion of the insulation layer was forward-tapered shape as shown in FIG. 1, and the taper angle θ was about 60°.

A light-blocking insulation layer was formed on a non-alkali glass plate in the same manner as described above, and light resistance of the insulation layer was evaluated. The optical density-retaining ratio (r) was 60%.

Using the obtained substrate on which the insulation layer was formed, an organic electroluminescent device was prepared. The thin layer including the luminescent layer was formed by the vacuum deposition method including the heating of a resistance wire. A hole transfer layer was formed by vapor deposition on the entire effective area of the substrate, and a luminescent layer and a second electrode made of aluminum were prepared using a shadow mask.

The thus obtained substrate was removed from the vapor deposition machine, and the substrate was laminated with a sealing glass plate using a UV-curing epoxy resin, and the laminate was sealed. A simple matrix type color organic electroluminescent device was prepared, which comprised a patterned luminescent layer formed on the striped ITO first electrode, and a striped second electrode arranged at right angles to the first electrode. The obtained display device was driven line-sequentially to obtain good display characteristics. At the boundary portion of the insulation layer, the thin film layer or the second electrode were not thinned or cut, and the layer was smoothly formed. Irregularity of brightness in the luminescent region was not observed, and stable luminescence was attained. The ratio of effective luminescent area (S) after the durability test was 70%.

EXAMPLE 2

In 250 ml of propylene glycol monomethyl ether, 176 g (0.1 mol) of t-butoxystyrene and 5.8 g (0.04 mol) of azobisisobutylonitrile were dissolved, and the mixture was allowed to react at 75° C. for 4 hours. To the obtained poly t-butoxystyrene solution, 50 g of 5 wt % aqueous sulfuric acid solution was added, and the hydrolysis reaction was carried out at 100° C. for 3 hours. The reaction product was washed three times with 1000 ml of deionized water, and 500 ml of propylene glycol monomethyl ether acetate was added thereto so as to exchange the solvent, thereby obtaining alkali-soluble resin (polyhydroxystyrene) solution.

The thus obtained alkali-soluble resin solution (corresponding to 100 parts by weight (solid component) of polyhydroxystyrene) was mixed with 30 parts by weight of the quinone diazide compound (H), 25 parts by weight of 4,4',4",4'''-(1,4-phenylenedimethylidene)tetrakis phenol (absorption maximum: 440 nm), 30 parts by weight of Pigment Blue 60 (indanthrone blue, absorption maximum: 570 nm, 720 nm), 10 parts by weight of Pigment Violet 19 (quinacridone red, absorption maximum: 510 nm, 550 nm, 600 nm) and 100 parts by weight of glass beads, and the obtained mixture was dissolved in propylene glycol monomethyl ether acetate to a solid concentration of 25% by weight. The resulting mixture was treated with a homogenizer at 7000 rpm for 30 minutes, and the glass beads were removed by filtration to obtain a positive-type ray-sensitive resin composition (varnish B 1).

The thus obtained varnish B1 was applied to the above-described substrate using a spinner, and the resultant was prebaked at 90° C. for 3 minutes on the hot plate to form a coating film having a thickness of 2.2 $\mu$m. Thereafter, the same operations as in Example 1 were repeated except that the heat treatment in the air in the clean oven was at 220° C. for 60 minutes to evaluate the obtained film and to prepare a display panel.

EXAMPLE 3

To a solution of 7 parts by weight of 2,2'-azobis(2,4-dimethylvaleronitrile) in 200 parts by weight of propylene glycol monomethyl ether acetate, were added 10 parts by weight of styrene, 20 parts by weight of methacrylic acid, 45 parts by weight of glycidyl methacrylate and 25 parts by weight of dicyclopentanyl methacrylate, and the mixture was slowly stirred after replacing the atmosphere with nitrogen. The solution was kept at the same temperature for 5 hours to obtain an acrylic resin solution.

The thus obtained acrylic resin solution (corresponding to 100 parts by weight (solid component) of acrylic resin) was mixed with 25 parts by weight of the quinone diazide compound (G), 25 parts by weight of 4,4',4"-methylidene trisphenol (absorption maximum: 460 nm) as a heatsensitive compound, 25 parts by weight of Pigment Blue 15:6 (Phthalocyanine Blue E, absorption maximum: 670 $\mu$m) and 15 parts by weight of Pigment Blue 60 (indanthrone blue, absorption maximum: 570 nm, 720 nm) as pigments, 2 parts by weight of an urethane-based dispersant (trademark "Disperbyk-182") and 100 parts by weight of glass beads, and the obtained mixture was dissolved in propylene glycol monomethyl ether acetate to a solid concentration of 25% by weight. The resulting mixture was treated with a homogenizer at 7000 rpm for 30 minutes, and the glass beads were removed by filtration to obtain a positive-type ray-sensitive resin composition (varnish C1). Thereafter, using this varnish C1, the same operations as in Example 1 were repeated to evaluate the obtained film and to prepare a display panel.

EXAMPLE 4

To 2.5 g of Pigment Blue 15:6 (Phthalocyanine Blue E, absorption maximum: 670 nm) and 1.5 g of Pigment Blue 60 (indanthrone blue, absorption maximum: 570 nm, 720 nm) which are the (d) components, 36 g of γ-butyrolactone was added, and the mixture was homogenized together with 50 g of glass beads by a homogenizer at 7000 rpm for 30 minutes. The glass beads were removed by filtration to obtain an organic pigment dispersed solution with a concentration of 10% by weight. To 32 g of the thus obtained dispersed solution, a mixture of 5 g of the alkali-soluble polymer (J), 1.25 g of 4,4',4"-tris(dimethylamino) triphenylmethane (absorption maximum: 600 nm), 2 g of the quinone diazide compound (H) and 9.75 g of ethyl lactate was added to obtain a positive-type photosensitive resin composition (varnish D1).

The thus obtained varnish D1 was applied to the above-described substrate by the slit die coating method, and the resultant was prebaked at 120° C. for 5 minutes on the hot plate to form a coating film having a thickness of 1.5 µm. Thereafter, the same operations as in Example 1 were repeated except that the heat treatment in the air in the clean oven was at 250° C. for 30 minutes to evaluate the obtained film and to prepare a display panel.

EXAMPLE 5

To 2 g of Pigment Blue 15:6 (Phthalocyanine Blue E, absorption maximum: 670 nm) as the (d) component, 10 g of the alkali-soluble polymer (K), 37 g of γ-butyrolactone, and 44 g of 3-methyl-3-methoxybutyl acetate were added, and the mixture was homogenized together with 50 g of glass beads by a homogenizer at 7000 rpm for 30 minutes, followed by removal of the glass beads by filtration. To the resultant, 3 g of the quinone diazide compound (H) and 4 g of 4-[bis(4-hydroxyphenyl)methyl]2-methoxyphenol (absorption maximum: 470 run) as a heatsensitive compound were added to obtain a positive-type photosensitive resin composition (varnish E1). Thereafter, using this varnish E1, the same operations as in Example 1 were repeated to evaluate the obtained film and to prepare a display panel.

EXAMPLE 6

To a mixed solvent of 39.95 g of γ-butyrolactone and 40 g of ethyl lactate, were added 10 g of the alkali-soluble polymer (L), 2.2 g of quinone diazide compound (F), 4,4',4"-methylidene trisphenol (absorption maximum: 460 nm) as a heatsensitive compound and 0.05 g of vinylmethoxy silane. To this mixture, 3.0 g of Valifast Black 1807 (absorption maximum: 580 nm) which is an azochrome complex salt dye and 2.4 g of Valifast Blue 2620 (absorption maximum: 680 nm) which is a phthalocyanine dye (both are carried on a catalogue of February, 2002, commercially available from Orientchemical Co., Ltd.) were added to obtain a positive-type photosensitive resin composition (varnish F1). Thereafter, using the thus obtained varnish F1, the same operations as in Example 4 were repeated except that the heat treatment in the air in the clean oven was at 230° C. for 30 minutes to evaluate the obtained film and to prepare a display panel.

EXAMPLE 7

To 5 g of Pigment Blue 15:6 (Phthalocyanine Blue E, absorption maximum: 670 run) and Pigment Blue 60 (indanthrone blue, absorption maximum: 570 nm, 720 nm) which are the (d) components, 20 g of the alkali-soluble polymer (M), 50 g of N-methyl-2-pyrrolidone and 110 g of 3-methyl-3-methoxybutyl acetate were added, and the mixture was homogenized together with 100 g of glass beads by a homogenizer at 7000 rpm for 30 minutes. The glass beads were removed by filtration. To the resulting mixture, 7 g of the quinone diazide compound (H) and 3 g of 4,4',4"-methylidene trisphenol (absorption maximum: 460 nm) as a heatsensitive compound were added to obtain a positive-type photosensitive resin composition (varnish G1). Thereafter, using the thus obtained varnish G1, the same operations as in Example 4 were repeated except that the heat treatment in the air in the clean oven was at 280° C. for 30 minutes to evaluate the obtained film and to prepare a display panel.

EXAMPLE 8

Six grams of Pigment Blue 60 (indanthrone blue, absorption maximum: 570 nm, 720 nm) and 2 g of Pigment Violet 19 (quinacridone red, absorption maximum: 510 nm, 550 nm, 600 nm) which are the (d) components were mixed with 20 g of γ-butyrolactone and 52 g of N-methyl-2-pyrrolidone, and the mixture was homogenized together with 50 g of glass beads by a homogenizer at 7000 rpm for 30 minutes. The glass beads were removed by filtration to obtain an organic pigment dispersed solution with a concentration of 10% by weight. To 40 g of this dispersed solution, a mixture of 4 g of the alkali-soluble polymer (N), 1 g of the quinone diazide compound (H), 1 g of 4,4',4",4'"-(1,4-phenylenedimethylidene)tetrakis phenol (absorption maximum: 440 nm) and 3 g of γ-butyrolactone was added to obtain a positive-type photosensitive resin composition (varnish H1). Thereafter, using the thus obtained varnish H1, the same operations as in Example 4 were repeated except that the heat treatment in the air in the clean oven was at 170° C. for 30 minutes and then at 320° C. for 60 minutes to evaluate the obtained film and to prepare a display panel.

EXAMPLE 9

Seven grams of Pigment Blue 15:6 (Phthalocyanine Blue E, absorption maximum: 670 nm) as the (d) component, 2 g of 4,4',4"-methylidene trisphenol (absorption maximum: 460 nm) as a heatsensitive compound, 3 g of 4,4',4",4'"-(1,4-phenylenedimethylidene)tetrakis phenol (absorption maximum: 440 nm), 20 g of the alkali-soluble polymer (P), 6.5 g of the quinone diazide compound (G), 80 g of N-methyl-2-pyrrolidone and 73.5 g of 3-methyl-3-methoxybutyl acetate were homogenized together with 100 g of glass beads by a homogenizer at 7000 rpm for 30 minutes, and the glass beads were removed by filtration to obtain a positive-type photosensitive resin composition (varnish J1). Thereafter, using the thus obtained varnish J1, the same operations as in Example 4 were repeated except that the heat treatment in the air in the clean oven was at 170° C. for 30 minutes and then at 350° C. for 30 minutes to evaluate the obtained film and to prepare a display panel.

COMPARATIVE EXAMPLE 1

The same operations as in Example 1 were repeated except that 35 parts by weight of the Pigment Blue 15:6 (Phthalocyanine Blue E, absorption maximum: 670 nm) was not used, to evaluate the obtained film and to prepare a display panel.

COMPARATIVE EXAMPLE 2

The same operations as in Example 2 were repeated except that 40 parts by weight of NK-2612 (commercially available from Hayashibara Biochemical Laboratories, Co., Ltd.) was used in place of 30 parts by weight of the Pigment Blue 60 (indanthrone blue, absorption maximum: 570 nm, 720 nm) and 10 parts by weight of Pigment Violet 19 (quinacridone red, absorption maximum: 510 nm, 550 nm, 600 nm), to evaluate the obtained film and to prepare a display panel.

COMPARATIVE EXAMPLE 3

The same operations as in Example 3 were repeated except that Pigment Blue 15:6 (Phthalocyanine Blue E, absorption maximum: 670 nm) and Pigment Blue 60 (indanthrone blue, absorption maximum: 570 nm, 720 nm) were not used, to evaluate the obtained film and to prepare a display panel.

COMPARATIVE EXAMPLE 4

The same operations as in Example 4 were repeated except that 1.25 g of 4,4',4"-tris(dimethylamino) triphenylmethane (absorption maximum: 600 nm) was not used, to evaluate the obtained film and to prepare a display panel.

COMPARATIVE EXAMPLE 5

The same operations as in Example 5 were repeated except that 4-[bis(4-hydroxyphenyl)methyl]2-methoxyphenol (absorption maximum: 470 nm) was not used, to evaluate the obtained film and to prepare a display panel.

COMPARATIVE EXAMPLE 6

The same operations as in Example 6 were repeated except that 5.4 g of Pigment Yellow 12 (disazo yellow AAA, absorption maximum: 420 nm) was used in place of 3 g of Valifast Black 1807 (absorption maximum: 580 mm) which is an azochrome complex salt dye and 2.4 g of Valifast Blue 2620 (absorption maximum: 680 nm) which is a phthalocyanine dye, to evaluate the obtained film and to prepare a display panel.

COMPARATIVE EXAMPLE 7

Under dry nitrogen gas flow, in 274 g of γ-butyrolactone solvent, 10.7 g (0.049 mol) of pyromellitic dianhydride, 16.1 g (0.05 mol) of benzophenone tetracarboxylic dianhydride, 6.2 g (0.025 mol) of 3,3'-diaminodiphenylsulfone, 14 g (0.07 mol) of 4,4'-diaminodiphenyl ether and 1.2 g (0.005 mol) of bis-3-(aminopropyl)tetramethylsiloxane were reacted at 60° C. for 3 hours, and then 0.2 g (0.002 mol) of maleic anhydride was added, followed by allowing the mixture to react at 60° C. for 1 hour to obtain a polyamic acid solution (polymer concentration: 15% by weight), which is a precursor.

Then 2.5 g of 4,4',4",4'''-(1,4-phenylenedimethylidene) tetrakis phenol (absorption maximum: 440 nm) as a heat-sensitive compound, 3 g of Pigment Blue 60 (indanthrone blue, absorption maximum: 570 nm, 720 nm) and 1 g of Pigment Violet 19 (quinacridone red, absorption maximum: 510 nm, 550 nm, 600 nm) as pigments, 60 g of the polyamic acid obtained above and 14.5 g of N-methyl-2-pyrrolidone were homogenized together with 100 g of glass beads by a homogenizer at 7000 rpm for 30 minutes, and the glass beads were removed by filtration to obtain a non-photosensitive resin composition (varnish Q1).

After applying the varnish Q1 on the above-described substrate, the resultant was prebaked at 145° C. to form a polyimide precursor film. A positive-type photoresist was applied on the thus formed coating film and the resultant was heat-dried at 90° C. to form a photoresist coating film. This photoresist film was exposed to UV light through a photomask, and the resultant was immersed in an alkali developer to simultaneously carry out the development of the photoresist coating film and the etching of the polyimide precursor film to form an opening. After the etching, the photoresist coating film which was not necessary any more was peeled off using methyl cellosolve acetate. The etched polyimide precursor film was heated in the air at 290° C. for 60 minutes in a clean oven to form a polyimide insulation layer. The O.D of the insulation layer was 1.8. The cross-section of the boundary portion of the insulation layer was forward-tapered shape, and the taper angle θ was about 85°.

Using the varnish Q1, a light-blocking insulation layer was formed on a non-alkali glass plate in the same manner as described above, and light resistance of the insulation layer was evaluated. The optical density-retaining ratio (r) was 95%.

Thereafter, a simple matrix organic electroluminescent device was prepared as in Example 1. The obtained display device was driven line-sequentially. As a result, since the shape of the cross-section was forward-tapered with a taper angle of about 85°, at the boundary portion of the insulation layer, the thin film layer or the second electrode tended to become thin, and irregularity in brightness in the luminescent region was observed. The ratio of effective luminescent area (S) after the durability test was 80%.

COMPARATIVE EXAMPLE 8

To 100 g of a negative-type photosensitive polyimide precursor varnish (UR-3100, commercially available from Toray Industries, Inc.), were added 10 g of 4,4',4"-methylidene trisphenol (absorption maximum: 460 nm) as a heatsensitive compound, 10 g of Pigment Blue 15:6 (Phthalocyanine Blue E, absorption maximum: 670 nm) and 6 g of Pigment Blue 60 (indanthrone blue, absorption maximum: 570 nm, 720 nm) as pigments to obtain a negative-type photosensitive resin composition (varnish R1). The obtained varnish R1 was applied by the spin-coating method on a substrate on which the first electrode was formed, and the resultant was prebaked on a hot plate at 80° C. for 1 hour. The thus formed coating film of varnish R1 was exposed through a photomask, and the non-exposed regions alone were dissolved in a developer (DV-505, commercially available from Toray Industries, Inc.), thereby developing the coating film, followed by rinsing the resultant with pure water. The resultant was cured by heating in the air in a clean oven at 180° C. for 30 minutes and then at 220° C. for 30 minutes to form an insulation layer. The O.D of the insulation layer was 0.9. The cross-section of the boundary portion of the insulation layer was rectangular, and the taper angle θ was about 900.

Using the varnish R1, a light-blocking insulation layer was formed on a non-alkali glass plate in the same manner as described above, and light resistance of the insulation layer was evaluated. The optical density-retaining ratio (r) was 90%.

Thereafter, a simple matrix organic electroluminescent device was prepared as in Example 1. The obtained display device was driven line-sequentially. As a result, since the shape of the cross-section was rectangular, at the boundary portion of the insulation layer, the thin film layer or the second electrode tended to become thin, and irregularity in brightness in the luminescent region was observed. The ratio of effective luminescent area (S) after the durability test was 70%.

COMPARATIVE EXAMPLE 9

An alkali-soluble photoresist V259-PA (trademark, Nippon Steel Chemical Co., Ltd.) was used. As the thermosensitive materials which turn black upon heating, which were to be preliminarily added to the above photo-setting resin, a thermoplastic resin containing 20 to 30% by weight of Crystal Violet Lactone (absorption maximum: 610 nm) as a color former and the thermoplastic resin containing 20 to 30% by weight of an oil-soluble phenolic resin as a developing agent were used. As the thermoplastic resin, transparent polyethylene terephthalate was used. The mixing ratio of the photosensitive resin: thermosensitive material containing color former: thermosensitive material containing developing agent was 2:1:1 by weight. The components were well dispersed in the photosensitive resin to prepare varnish S1.

This varnish S1 was applied by the spin-coating method on a substrate on which the first electrode was formed, and the resultant was prebaked on a hot plate at 80° C. for 3 minutes. The thus formed coating film of varnish S1 was exposed through a photomask, and the film was developed with aqueous sodium carbonate solution, followed by rinsing the resultant with pure water. The resultant was then heated at 200° C. for 30 minutes using a hot plate to dissolve the heatsensitive microcapsules incorporated in the photo-setting resin layer to react the color former and the developing agent to make the photo-setting resin layer black, thereby preparing a resin black matrix insulation layer. The O.D of the thus obtained insulation layer was 2.0. The shape of the cross-section was rectangular, and the taper angle θ was about 90°.

Using the varnish SI, a light-blocking insulation layer was formed on a non-alkali glass plate in the same manner as described above, and light resistance of the insulation layer was evaluated. The optical density-retaining ratio (r) was 20%.

Thereafter, a simple matrix organic electroluminescent device was prepared as in Example 1. The obtained display device was driven line-sequentially. As a result, since the shape of the cross-section was rectangular, at the boundary portion of the insulation layer, the thin film layer or the second electrode tended to become thin, and irregularity in brightness in the luminescent region was observed. The ratio of effective luminescent area (S) after the durability test was 70%.

The results of evaluation of the characteristics of the products of Examples 1 to 9 and Comparative Examples 1 to 9 are shown in Table 1 below.

TABLE 1

|  | Heatsensitive Compound (Absorption Max.: not less than 350 nm and less than 700 nm) | Pigment |
|---|---|---|
| Example 1 | 4,4',4"-tris(dimethylamino)triphenylmethane (Absorption Max. 600 nm) | Pigment Blue 15:6 (Absorption Max. 670 nm) |
| Example 2 | 4,4',4",4'''-(1,4-phenylenedimethylidene)tetrakisphenol (Absorption Max. 440 nm) | Pigment Blue 60 (Absorption Max. 570 nm, 720 nm) Pigment Violet 19 (Absorption Max. 510 nm, 550 nm, 600 nm) |
| Example 3 | 4,4',4"-methylidenetrisphenol (Absorption Max. 460 nm) | Pigment Blue 15:6 (Absorption Max. 670 nm) Pigment Blue 60 (Absorption Max. 570 nm, 720 nm) |
| Example 4 | 4,4',4"-tris(dimethylamino)triphenylmethane (Absorption Max. 600 nm) | Pigment Blue 15:6 (Absorption Max. 670 nm) Pigment Blue 60 (Absorption Max. 570 nm, 720 nm) |
| Example 5 | 4-[bis(4-hydroxyphenyl)methyl]2-methoxyphenol (Absorption Max. 470 nm) | Pigment Blue 15:6 (Absorption Max. 670 nm) |
| Example 6 | 4,4',4"-methylidenetrisphenol (Absorption Max. 460 nm) | Valifast Black 1807 (Absorption Max. 580 nm) Valifast Blue 2620 (Absorption Max. 680 nm) |
| Example 7 | 4,4',4"-methylidenetrisphenol (Absorption Max. 460 nm) | Pigment Blue 15:6 (Absorption Max. 670 nm) Pigment Blue 60 (Absorption Max. 570 nm, 720 nm) |
| Example 8 | 4,4',4",4'''-(1,4-phenylenedimethylidene)tetrakisphenol (Absorption Max. 440 nm) | Pigment Blue 60 (Absorption Max. 570 nm, 720 nm) Pigment Violet 19 (Absorption Max. 510 nm, 550 nm, 600 nm) |
| Example 9 | 4,4',4"-methylidenetrisphenol (Absorption Max. 460 nm) 4,4',4",4'''-(1,4-phenylenedimethylidene)tetrakisphenol (Absorption Max. 440 nm) | Pigment Blue 15:6 (Absorption Max. 670 nm) |

|  | OD Value | Evaluation of Light Resistance r(%) | Shape of Cross-section | Taper Angle θ | Initial Luminescence Characteristic | Evaluation of Durability of Luminescence S(%) |
|---|---|---|---|---|---|---|
| Example 1 | 0.5 | 60 | Forward-tapered | 60 | Good | 70 |
| Example 2 | 0.85 | 95 | Forward-tapered | 60 | Good | 80 |
| Example 3 | 0.9 | 90 | Forward-tapered | 60 | Good | 80 |
| Example 4 | 0.5 | 60 | Forward-tapered | 45 | Good | 100 |
| Example 5 | 0.75 | 90 | Forward-tapered | 45 | Good | 100 |
| Example 6 | 0.8 | 90 | Forward-tapered | 30 | Good | 100 |
| Example 7 | 1.0 | 95 | Forward-tapered | 30 | Good | 100 |
| Example 8 | 1.3 | 95 | Forward-tapered | 45 | Good | 100 |
| Example 9 | 1.1 | 95 | Forward-tapered | 45 | Good | 100 |

TABLE 1-continued

| | Heatsensitive Compound (Absorption Max.: not less than 350 nm and less than 700 nm) | Pigment |
|---|---|---|
| Comparative Example 1 | 4,4',4"-tris(dimethylamino)triphenylmethane (Absorption Max. 600 nm) | — |
| Comparative Example 2 | 4,4',4",4'''-(1,4-phenylenedimethylidene)tetrakisphenol (Absorption Max. 440 nm) | NK-2612 (Absorption Max. 790 nm) |
| Comparative Example 3 | 4,4',4"-methylidenetrisphenol (Absorption Max. 460 nm) | — |
| Comparative Example 4 | — | Pigment Blue 15:6 (Absorption Max. 670 nm) |
| Comparative Example 5 | — | Pigment Blue 60 (Absorption Max. 570 nm, 720 nm) Pigment Blue 15:6 (Absorption Max. 670 nm) |
| Comparative Example 6 | 4,4',4"-methylidenetrisphenol (Absorption Max. 460 nm) | Pigment Yellow 12 (Absorption Max. 420 nm) |
| Comparative Example 7 | 4,4',4",4'''-(1,4-phenylenedimethylidene)tetrakisphenol (Absorption Max. 440 nm) | Pigment Blue 60 (Absorption Max. 570 nm, 720 nm) Pigment Violet 19 (Absorption Max. 510 nm, 550 nm, 600 nm) |
| Comparative Example 8 | 4,4',4"-methylidenetrisphenol (Absorption Max. 460 nm) | Pigment Blue 15:6 (Absorption Max. 670 nm) Pigment Blue 60 (Absorption Max. 570 nm, 720 nm) |
| Comparative Example 9 | Crystal Violet Lactone (Absorption Max. 610 nm) | — |

| | | Evaluation of Light Resistance | | | | Evaluation of Durability of Luminescence |
|---|---|---|---|---|---|---|
| | OD Value | r(%) | Shape of Cross-section | Taper Angle θ | Initial Luminescence Characteristic | S(%) |
| Comparative Example 1 | 0.25 | 10 | Rectangular | 90 | Irregularities in Brightness Occurred | 50 |
| Comparative Example 2 | 0.2 | 40 | Rectangular | 90 | Irregularities in Brightness Occurred | 70 |
| Comparative Example 3 | 0.2 | 40 | Forward-tapered | 85 | Irregularities in Brightness Occurred | 70 |
| Comparative Example 4 | 0.25 | 95 | Forward-tapered | 60 | Good | 100 |
| Comparative Example 5 | 0.2 | 100 | Forward-tapered | 60 | Good | 100 |
| Comparative Example 6 | 0.25 | 30 | Forward-tapered | 45 | Good | 100 |
| Comparative Example 7 | 1.8 | 95 | Forward-tapered | 85 | Irregularities in Brightness Occurred | 80 |
| Comparative Example 8 | 0.9 | 90 | Rectangular | 90 | Irregularities in Brightness Occurred | 70 |
| Comparative Example 9 | 2.0 | 20 | Rectangular | 90 | Irregularities in Brightness Occurred | 70 |

We claim:

1. A positive-type photosensitive resin composition comprising:
   (a) an alkali-soluble resin;
   (b) a quinone diazide compound;
   (c) a heat-sensitive compound which colors upon being heated and which shows an absorption maximum at a wavelength of not less than 350 nm and not more than 700 nm; and
   (d) a compound which does not have an absorption maximum at a wavelength of not less than 350 nm to less than 500 nm, and has an absorption maximum at a wavelength of not less than 500 nm and not more than 750 nm.

2. The composition according to claim 1, wherein said quinone diazide compound is an esterified quinone diazide compound.

3. The composition according to claim 1, wherein said (a) component is at least one selected from the group consisting of phenol resins and polymers containing radical-polymerizable monomers having alkali-soluble groups.

4. The composition according to claim 1, wherein said (a) component contains as a major constituent a structural unit represented by the Formula (1):

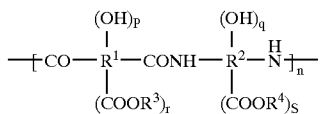

(1)

wherein $R^1$ represents an organic group having not less than 2 carbon atoms and a valence of 2 to 8; $R^2$ represents an organic group having not less than 2 carbon atoms and a valence of 2 to 6; $R^3$ and $R^4$ independently represent hydrogen or organic groups having 1 to 20 carbon atoms; n represents a number ranging from 5 to 100,000; p and q independently represent integers of 0 to 4; and r and s independently represent integers of 0 to 2; and p+q>0.

5. The photosensitive resin composition according to claim 4, wherein said (a) component is at least one selected from the group consisting of the resins represented by, or containing one or more structural units, of the following formulae:

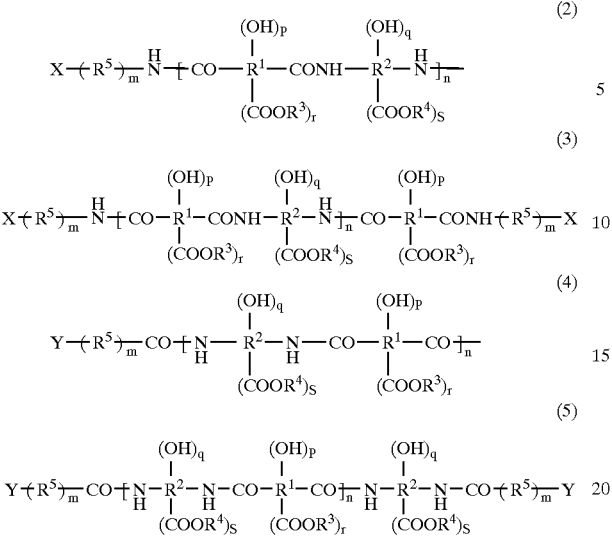

wherein in Formulae (2) to (5), $R^1$ represents an organic group having not less than 2 carbon atoms and a valence of 2 to 8; $R^2$ represents an organic group having not less than 2 carbon atoms and a valence of 2 to 6; $R^3$ and $R^4$ independently represent hydrogen or organic groups having 1 to 20 carbon atoms; $R^5$ represents a divalent organic group; X and Y independently represent organic groups having at least one substituent selected from the group consisting of $C_1$–$C_{10}$ hydrocarbon groups containing at least one organic group selected from the group consisting of carboxyl group, phenolic hydroxyl group, sulfonic group and unsaturated hydrocarbon groups, nitro group, methylol group, ester group, hydroxyalkinyl group and $C_1$–$C_{10}$ hydrocarbon groups; n represents a number ranging from 5 to 100,000; m represents an integer of 0 to 10; p and q independently represent integers of 0 to 4; and r and s independently represent integers of 0 to 2; and p+q>0.

6. The composition according to claim 5, wherein s is 0 in said Formulae (2) to (5).

7. The composition according to claim 1, wherein said (c) component is a heat-sensitive compound which colors upon being heated and which shows an absorption maximum at a wavelength of not less than 350 nm and not more than 500 nm.

8. The composition according to claim 1, wherein said (c) component is a hydroxyl group-containing compound having a triarylmethane skeleton.

9. The composition according to claim 1, wherein a cured film obtained by curing the composition has an optical density of not less than 0.5.

10. The composition according to claim 1, wherein a cured film obtained by curing the composition retains not less than 50% of its initial optical density after irradiation of light for 500 hours.

11. A process for producing a patterned film comprising, in the order mentioned, the steps of applying said photosensitive composition according to any one of claims 1 to 10 on a substrate and drying the applied composition; exposing the composition; developing the exposed composition with an alkali developer; and heat treating the developed composition.

12. The patterned resin film obtained by the process according to claim 11.

13. An organic electroluminescent display comprising a patterned resin film obtained from the composition according to any one of claims 1 to 10.

14. An organic electroluminescent display comprising the patterned resin film according to claim 12.

* * * * *